US009798252B2

(12) United States Patent
Miyakawa

(10) Patent No.: US 9,798,252 B2
(45) Date of Patent: Oct. 24, 2017

(54) EXPOSURE APPARATUS, MOVABLE BODY APPARATUS, AND DEVICE MANUFACTURING METHOD

(71) Applicant: NIKON CORPORATION, Tokyo (JP)

(72) Inventor: Tomoki Miyakawa, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 96 days.

(21) Appl. No.: 14/646,160

(22) PCT Filed: Nov. 20, 2013

(86) PCT No.: PCT/JP2013/081323
§ 371 (c)(1),
(2) Date: Sep. 28, 2015

(87) PCT Pub. No.: WO2014/080957
PCT Pub. Date: May 30, 2014

(65) Prior Publication Data
US 2016/0033883 A1    Feb. 4, 2016

(30) Foreign Application Priority Data

Nov. 20, 2012   (JP) .................................. 2012-253984

(51) Int. Cl.
*G02B 27/58*    (2006.01)
*G03F 7/20*     (2006.01)

(52) U.S. Cl.
CPC ...... *G03F 7/70775* (2013.01); *G03F 7/70725* (2013.01)

(58) Field of Classification Search
CPC .................... G03F 7/70775; G03F 7/70766
USPC ..................................................... 355/53, 72
See application file for complete search history.

(56) References Cited

U.S. PATENT DOCUMENTS

| 5,196,745 | A | 3/1993 | Trumper |
| 5,448,332 | A | 9/1995 | Sakakibara et al. |
| 6,445,093 | B1 | 9/2002 | Binnard |
| 6,452,292 | B1 | 9/2002 | Binnard |
| 6,590,634 | B1 | 7/2003 | Nishi et al. |
| 6,611,316 | B2 | 8/2003 | Sewell |
| 6,778,257 | B2 | 8/2004 | Bleeker et al. |

(Continued)

FOREIGN PATENT DOCUMENTS

| EP | 1 357 429 A1 | 10/2003 |
| WO | 99/49504 A1 | 9/1999 |
| WO | 2005/074014 A1 | 8/2005 |

OTHER PUBLICATIONS

Jan. 9, 2017 Extended Search Report issued in European Patent Application No. 13856886.0.

(Continued)

*Primary Examiner* — Hung Henry Nguyen
(74) *Attorney, Agent, or Firm* — Oliff PLC

(57) ABSTRACT

According to measurement results of an encoder system, a stage driving system that is a magnetic levitation type planar motor is controlled to drive and control a wafer stage, and in the case where an abnormality of the driving and control of the wafer stage has been detected, the stage driving system is controlled to apply a thrust in a vertical direction to the wafer stage. With this operation, the pitching of the wafer stage can be avoided, which makes it possible to prevent damage of the wafer stage and structures placed immediately above the stage upper surface.

18 Claims, 12 Drawing Sheets

(56) References Cited

U.S. PATENT DOCUMENTS

| | | |
|---|---|---|
| 7,023,610 B2 | 4/2006 | Ohtsuki et al. |
| 2003/0025890 A1 | 2/2003 | Nishinaga |
| 2006/0227309 A1 | 10/2006 | Loopstra et al. |
| 2007/0127006 A1 | 6/2007 | Shibazaki |
| 2008/0088843 A1 | 4/2008 | Shibazaki |
| 2010/0227263 A1* | 9/2010 | Sato .............. G03B 27/58 430/30 |
| 2011/0075120 A1* | 3/2011 | Ichinose ............ G03F 7/70766 355/53 |
| 2011/0085150 A1* | 4/2011 | Ichinose ............ G03F 7/707 355/67 |

OTHER PUBLICATIONS

Feb. 18, 2014 Search Report issued in International Patent Application No. PCT/JP2013/081323.

May 26, 2015 IPRP and Written Opinion issued in International Patent Application No. PCT/JP2013/081323.

* cited by examiner

EXPOSURE APPARATUS, MOVABLE BODY APPARATUS, AND DEVICE MANUFACTURING METHOD

TECHNICAL FIELD

The present invention relates to exposure apparatuses, movable body apparatuses and device manufacturing methods, and more particularly to an exposure apparatus used in a lithography process of manufacturing semiconductor devices (such as integrated circuits), liquid crystal display elements and the like, a movable body apparatus that drives a movable body and a device manufacturing method that uses the exposure apparatus.

BACKGROUND ART

In a lithography process of manufacturing electronic devices (microdevices) such as semiconductor devices and liquid crystal display elements, a projection exposure apparatus of a step-and-repeat method (a so-called stepper), and a projection exposure apparatus by a step-and-scan method (a so-called scanning stepper (which is also called a scanner)) are mainly used. In these exposure apparatuses, illumination light is projected on a wafer (or a glass plate or the like) coated with photosensitive agent (resist) via a reticle (or a mask) and a projection optical system, and thereby (a reduced image of) a pattern formed on the reticle is sequentially transferred to a plurality of shot areas on the wafer.

Due to the finer pattern accompanying the higher integration of semiconductor devices in recent years, position control of a wafer stage with high accuracy has been required. Therefore, instead of a conventional position measurement system configured using a laser interferometer, a position measurement system configured using an encoder having a measurement resolution of a same level as or a higher level than the laser interferometer and a surface position sensor has come to be employed. For example, an encoder system and a surface position sensor system, which are employed in an exposure apparatus disclosed in PTL 1, project measurement beams on (a reflection type diffraction grating configuring) a measurement surface provided on a wafer stage, detect reflection beams of the measurement beams, and thereby measure the displacement in a periodic direction of the diffraction grating or the surface position (the position in a Z-axis direction) of the measurement surface (i.e., the wafer stage).

In order to raise the positioning accuracy of a wafer as well as improving the throughput, a planar motor that two-dimensionally drives a wafer stage that moves holding the wafer, e.g., a planar motor structured by coupling, for two axes, a linear pulse motor of a variable reluctance driving method that is capable of driving the wafer stage in a noncontact manner, a planar motor by the Lorentz electromagnetic force driving made by expanding a liner motor in two-dimensional directions (e.g., PTL 2), and further, a planar motor made of layering armature coils arrayed in one direction of two-dimensional directions and armature coils arrayed in the other direction of the two-dimensional directions (e.g., PTL 3 and PTL 4) have been developed.

In the case of a planar motor of a magnetic levitation method, a driving point on which a driving force acts (a bottom part of the wafer stage on which a mover is provided) is spaced apart from the center of gravity of the wafer stage. Therefore, in the case where the wafer stage goes out of control during the driving of the wafer stage, if the wafer stage is stopped by, for example, applying a dynamic brake on the wafer stage or causing the wafer stage to collide against a shock absorber or the like, then the pitching (the rotation tilted forward) is generated due to an inertial force, which may cause the upper surface (a wafer table) of the wafer stage to collide against a structure placed immediately above the upper surface and to suffer damage. In particular, in the encoder system and the surface position sensor system referred to above, the encoder (heads) and the surface position sensor (heads) that configure the systems are placed at the height of around 1 mm or more from the upper surface of the wafer stage. Further, in an exposure apparatus of a liquid immersion exposure method that exposes a wafer by irradiating illumination light via a projection optical system and liquid in a liquid immersion space (e.g., PTL 5), a liquid immersion device such as a nozzle that supplies immersion liquid to the liquid immersion space between the projection optical system and the wafer is placed immediately above the wafer stage.

CITATION LIST

Patent Literature

[PTL 1] U.S. Pat. No. 6,445,093
[PTL 2] U.S. Pat. No. 6,452,292
[PTL 3] U.S. Patent Application Publication No. 2008/0088843
[PTL 4] U.S. Pat. No. 5,196,745
[PTL 5] PCT International Publication No. 99/49504

SUMMARY OF INVENTION

Solution to Problem

The present invention has been made under the circumstances as described above, and according to a first aspect of the present invention, there is provided an exposure apparatus that forms a pattern on an object by irradiating the object with an energy beam, the apparatus comprising: a movable body that holds the object and moves on a base; a planar motor that generates a driving force in a first direction intersecting an upper surface of the base and a driving force in a second direction along the upper surface, to the movable body, using a mover provided at the movable body and a stator provided at the base to face the mover; a first position measurement system that measures a position of the movable body at least in the second direction; and a control system that controls the planar motor to drive the movable body at least in the second direction, using a measurement result of the first position measurement system, and when detecting an abnormality in the driving of the movable body, controls the planar motor to apply a driving force, directed from the movable body to the upper surface of the base in the first direction, to the movable body.

With this exposure apparatus, in the case where an abnormality has been detected in driving of the movable body, a driving force directed from the movable body to the upper surface of the base in a first direction is applied to the movable body by controlling the planar motor, and thereby the pitching of the movable body can be avoided, which makes it possible to prevent the damage of the movable body and structures placed immediately above the movable body.

According to a second aspect of the present invention, there is provided a movable body apparatus, comprising: a base member; a movable body that is movable in two dimensions on the base member; a planar motor of a magnetic levitation method that has a stator provided at the base member and a mover provided at the movable body; and a controller that generates a driving force directed from the movable body toward the base member, with the planar motor, in order to suppress the movable body from moving apart from the base member in a direction orthogonal to a plane including the two dimensions while the movable body moves in the two dimensions.

With this movable body apparatus, the controller generates a driving force directed from the movable body toward the base member, thereby suppressing the movable body from moving apart from the base member in a direction orthogonal to a plane including two dimensions while the movable body moves in the two dimensions.

According to a third aspect of the present invention, there is provided an exposure apparatus having the movable body apparatus of the present invention.

According to a fourth aspect of the present invention, there is provided a device manufacturing method using the exposure apparatus of the present invention.

DESCRIPTION OF EMBODIMENTS

An embodiment of the present invention will be described below, with reference to FIGS. 1 to 12.

Figure 1:
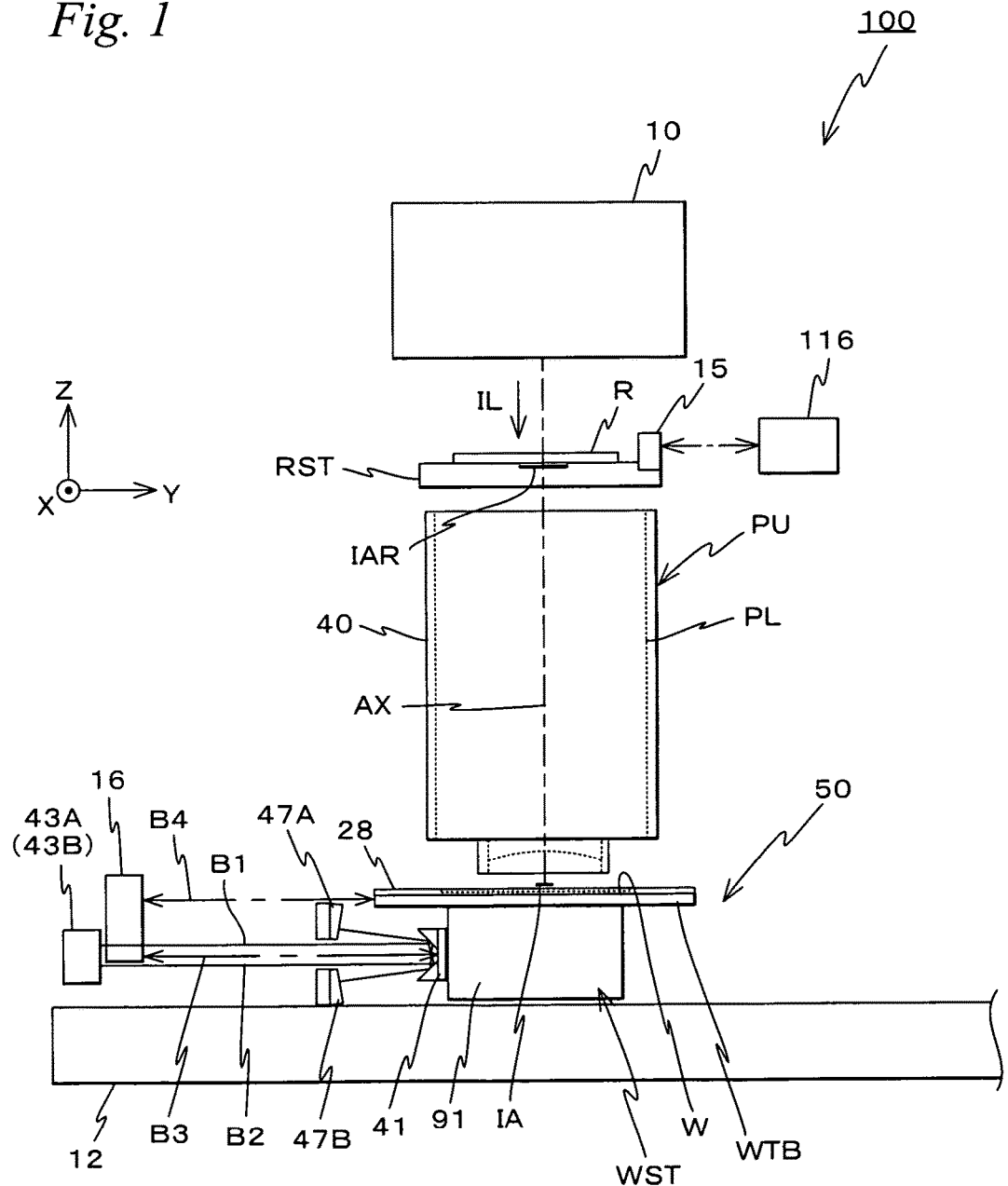
FIG. 1 is a view schematically showing a configuration of an exposure apparatus related an embodiment.

FIG. 1 schematically shows a configuration of an exposure apparatus 100 related to the embodiment. Exposure apparatus 100 is a projection exposure apparatus of a step-and-scan method, which is a so-called scanner. As will be described later, in the present embodiment, a projection optical system PL and a primary alignment system AL1 (see the drawings such as FIGS. 7 and 8) are provided. In the description below, the explanation is given assuming that a direction parallel to an optical axis AX of projection optical system PL is a Z-axis direction, a direction parallel to a straight line that connects optical axis AX and a detection center of primary alignment system AL1 within a plane orthogonal to the Z-axis direction is a Y-axis direction, a direction orthogonal to the Z-axis and the Y-axis is an X-axis direction, and rotation (tilt) directions around the X-axis, the Y-axis and the Z-axis are θx, θy and θz directions, respectively.

Exposure apparatus 100 is equipped with an illumination system 10, a reticle stage RST, a projection unit PU, a stage device 50 having a wafer stage WST, a control system thereof, and the like. In FIG. 1, a wafer W is mounted on wafer stage WST.

Illumination system 10 illuminates an illumination area IAR having a slit-like shape on a reticle R defined by a reticle blind (a masking system) with illumination light (exposure light) IL with substantially uniform illuminance. The configuration of illumination system 10 is disclosed in, for example, U.S. Application Publication No. 2003/0025890 and the like. Herein, as illumination light IL, ArF excimer laser beam (with a wavelength of 193 nm) is used as an example.

On reticle stage RST, reticle R having a pattern surface (a lower surface in FIG. 1) on which a circuit pattern and the like are formed is fixed by, for example, vacuum suction. Reticle stage RST is finely drivable within an XY plane and also drivable with a predetermined scanning velocity in a scanning direction (the Y-axis direction that is a lateral direction on the page surface of FIG. 1), by a reticle stage driving system 11 (not shown in FIG. 11, see FIG. 10) including, for example, a linear motor or the like.

Positional information within the XY plane (including rotational information in the θz direction) of reticle stage RST is constantly detected at a resolution of, for example, around 0.25 nm with a reticle laser interferometer (hereinafter, referred to as "reticle interferometer") 116 via a movable mirror 15 (or a reflection surface formed at the end surface of reticle stage RST). The measurement values of reticle interferometer 116 are sent to a main controller 20 (not shown in FIG. 1, see FIG. 10).

Projection unit PU is placed below reticle stage RST in FIG. 1. Projection unit PU includes a lens barrel 40 and projection optical system PL held within lens barrel 40. As projection optical system PL, for example, a dioptric system composed of a plurality of optical elements (lens elements) arrayed along optical axis AX parallel to the Z-axis direction is used. Projection optical system PL is, for example, both-side telecentric, and has a predetermined projection magnification (such as ¼ times, ⅕ times or ⅛ times). Therefore, when illumination area IAR on reticle R is illuminated by illumination system 10, illumination light IL, which has passed though reticle R whose pattern surface is placed substantially coincident with a first plane (an object plane) of projection optical system PL, forms a reduced image of a circuit pattern (a reduced image of a part of the circuit pattern) of reticle R within illumination area IAR, onto an area (hereinafter, also referred to as an exposure area) IA, conjugate with illumination area IAR described above, on wafer W whose surface is coated with resist (sensitive agent) and which is placed on a second plane (an image plane) side.

Then, by driving in synchronization of reticle stage RST and wafer stage WST, reticle R is moved in a scanning direction (the Y-axis direction) relative to illumination area IAR (illumination light IL) and also wafer W is moved in the scanning direction (the Y-axis direction) relative to exposure area IA (illumination light IL), and thereby scanning exposure of one shot area (a divided area) on wafer W is performed and a pattern of the reticle is transferred onto the shot area. That is, in the present embodiment, a pattern is generated on wafer W by illumination system 10, reticle R and projection optical system PL, and the pattern is formed on wafer W by exposure of a sensitive layer (a resist layer) on wafer W with illumination light IL.

Figure 10:
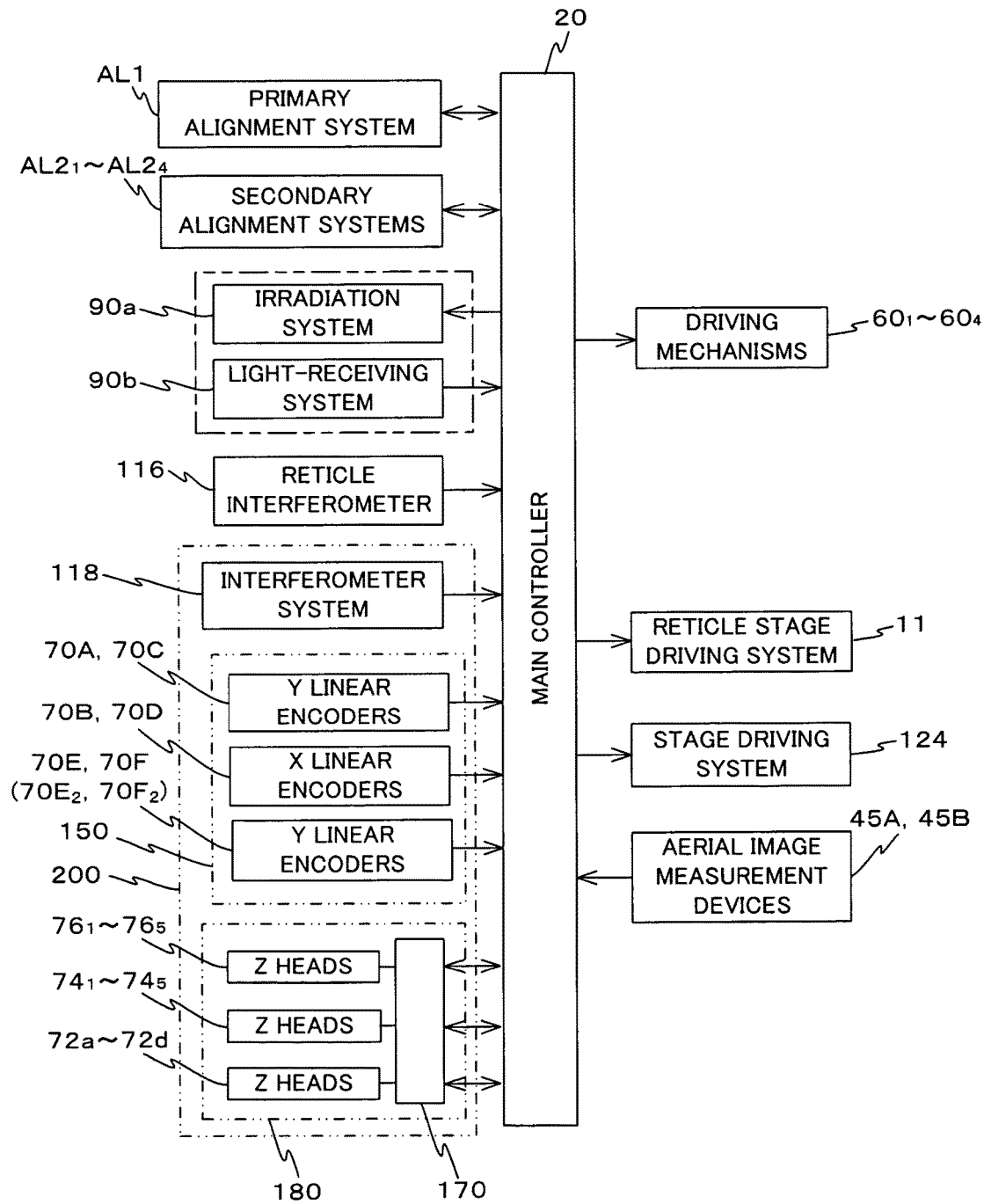
FIG. 10 is a block diagram showing a main configuration of a control system of the exposure apparatus related to the embodiment.
Figure 11A:
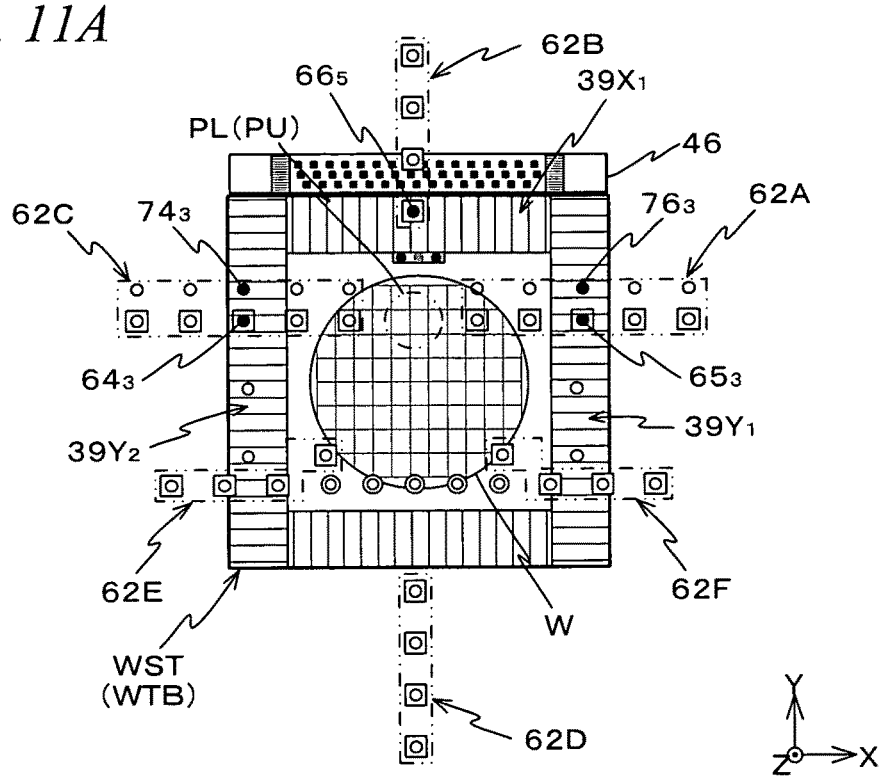
FIG. 11A is a view used to explain position measurement of the wafer stage using the encoders and the Z heads during an exposure process.
Figure 11B:
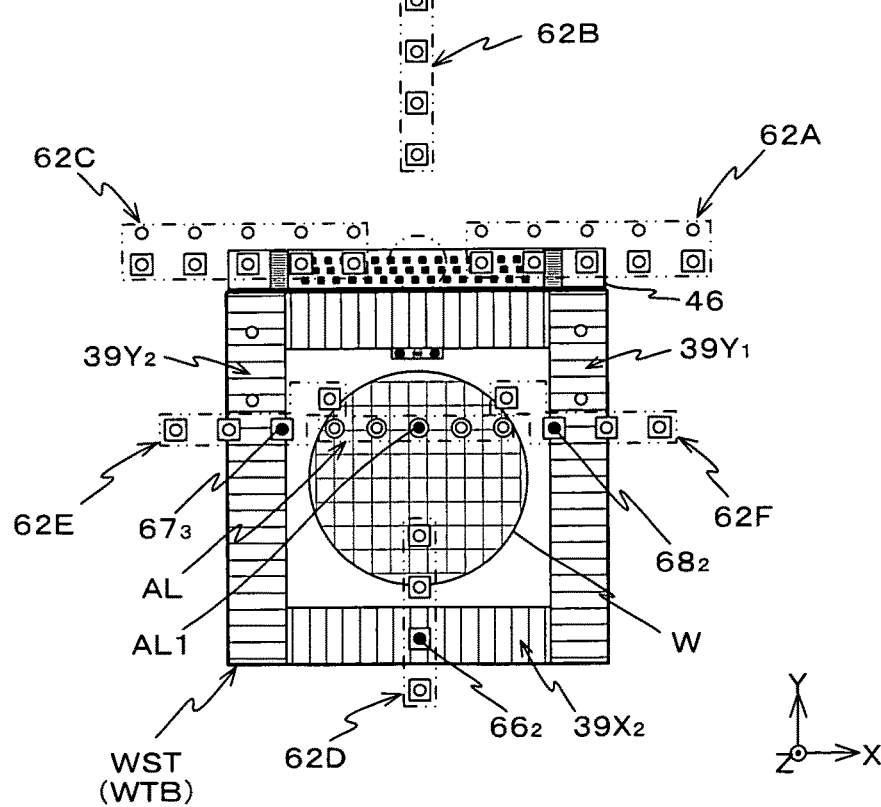
FIG. 11B is a view used to explain position measurement of the wafer stage using the encoders during an alignment measurement.

As shown in FIG. 1, stage device 50 is equipped with a base board 12, wafer stage WST placed on base board 12, a measurement system 200 (see FIG. 10) that measures positional information of wafer stage WST and a stage driving system 124 (see FIG. 10) that drives wafer stage WST, and the like. As shown in FIG. 10, measurement system 200 includes an interferometer system 118, an encoder system 150 and a surface position sensor system 180, and the like.

In an upper part of base board 12, a stator 60, which will be described later, is housed.

Wafer stage WST includes a stage main body 91 and a wafer table WTB loaded on the stage main body. Stage main body 91 has a mover 51. Mover 51 and stator 60 provided in base board 12 configure a planar motor 124 (also referred to as stage driving system 124).

Figure 2A:
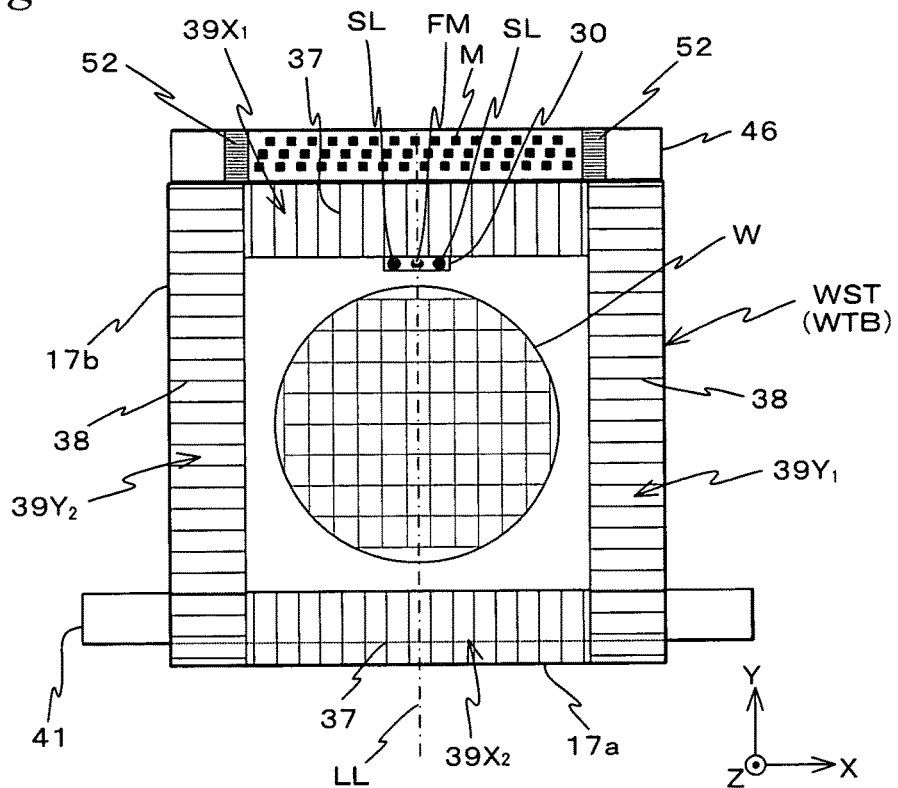
FIG. 2A is a plan view showing a wafer stage.
Figure 2B:
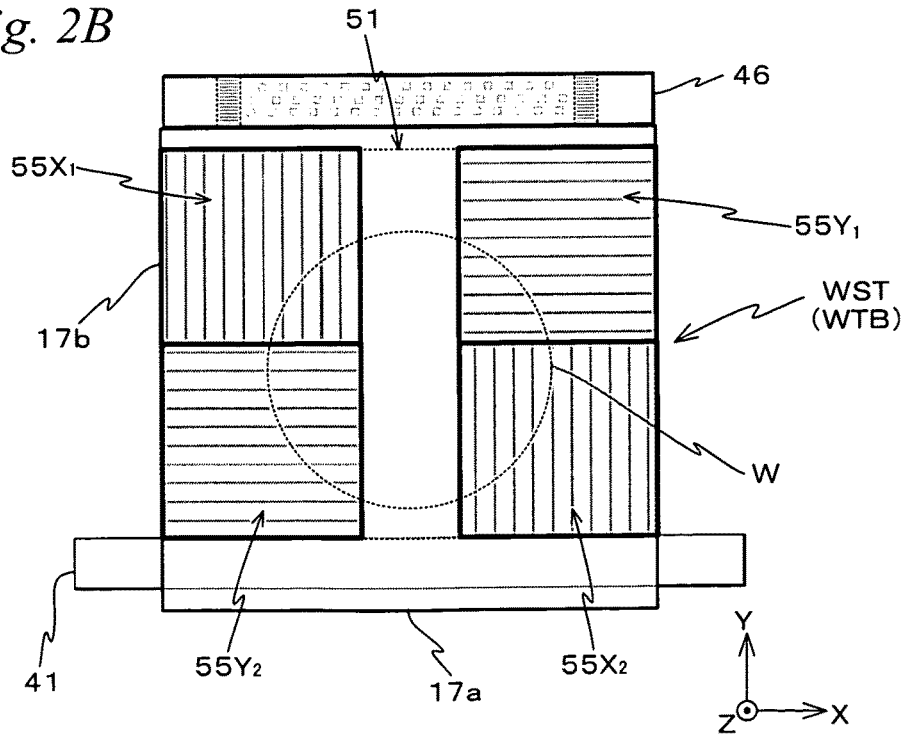
FIG. 2B is a plan view showing an array of magnet units (magnets) in the wafer stage.
Figure 3:
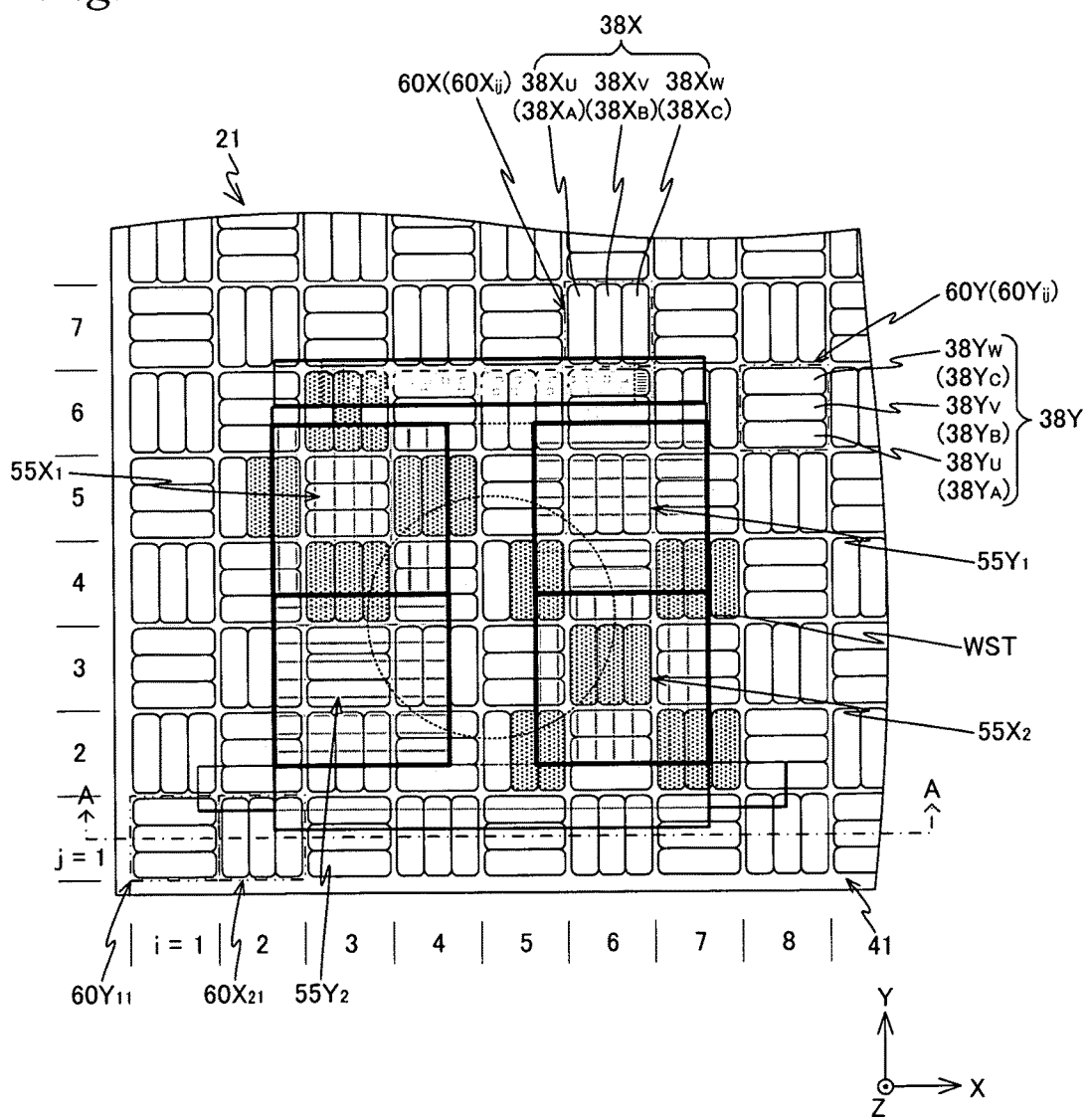
FIG. 3 is a plan view showing a configuration of a stage device, in particular, an array of coil units (armature coils) in a base board that configure a stage driving system (a planar motor).
Figure 4:
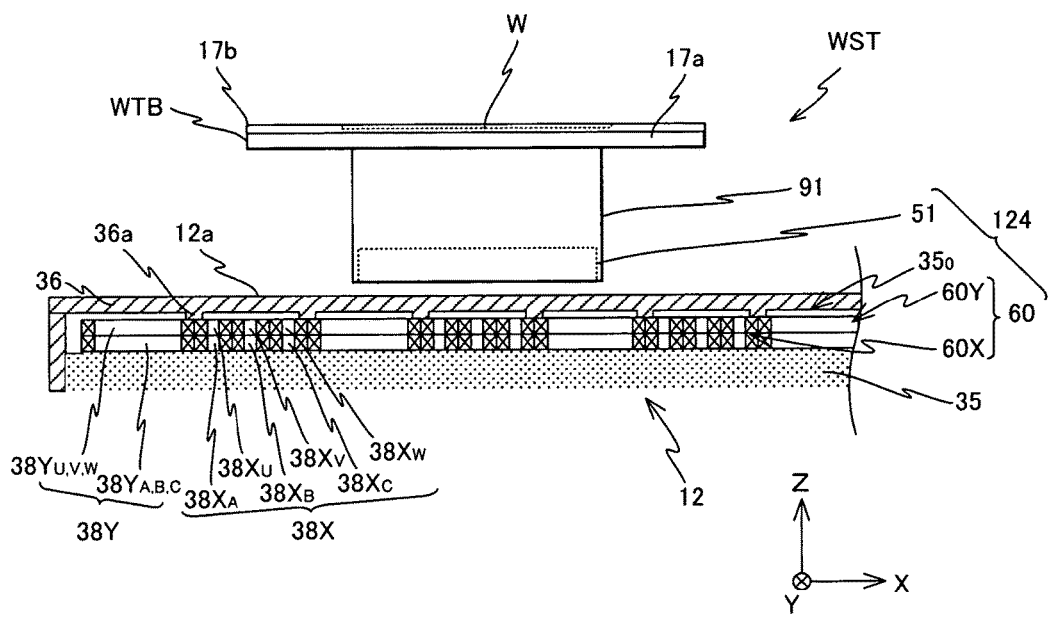
FIG. 4 is a cross-sectional view taken along the line A-A of FIG. 3.

The respective constituents of wafer stage WST, in particular, planar motor 124 (stage driving system 124) will be described in detail. FIG. 2A shows a plan view of wafer stage WST. FIG. 2B shows a plan view illustrating an array of magnet units $55X_1$, $55X_2$, $55Y_1$ and $55Y_2$ in wafer stage WST. FIG. 3 shows a plan view illustrating stage device 50, in particular, an array of armature coils 38X and 38Y in base board 12. FIG. 4 shows a cross-sectional view taken along the line A-A of FIG. 3.

Mover 51 is provided at the bottom part of stage main body 91 (see FIG. 4), and as shown in FIG. 2B, has magnet units $55X_1$ and $55X_2$ at a −X, +Y part and a +X, −Y part, respectively, and magnet units $55Y_1$ and $55Y_2$ at a +X, +Y part and a −X, −Y part, respectively. Magnet units $55X_1$ and $55X_2$ are configured with cuboid-shaped magnets having a longitudinal direction in the Y-axis direction that are arrayed so that the polarities of pole faces adjacent to each other in the X-axis direction are different from each other. Magnet units $55Y_1$ and $55Y_2$ are configured with cuboid-shaped magnets having a longitudinal direction in the X-axis direction that are arrayed so that the polarities of pole faces adjacent to each other in the Y-axis direction are different from each other.

As shown in FIG. 4, base board 12 is equipped with a main body part 35 that is hollow having an opened upper surface and a ceramic plate 36 that closes an opening section of main body part 35. On a surface (an upper surface), that faces mover 51, of ceramic plate 36, a movement surface 12a for mover 51 is formed.

As can be seen from FIGS. 3 and 4, in an inner space $35_0$ of base board 12 formed by main body part 35 and ceramic plate 36, a plurality of armature coils 38X and 38Y are placed along movement surface 12a. As armature coils 38X and 38Y, a rectangular coil having a long side whose length is three times longer than a length of a short side is used. Armature coils 38X (38Y) configure one rectangular X coil unit 60X (Y coil unit 60Y) having four sides of lengths equal to one another, with three coils that are arrayed in the X-axis direction (the Y-axis direction) with their longitudinal directions oriented in the Y-axis direction (the X-axis direction), and to be layered on these three coils (see FIG. 4), three coils similarly arrayed in the X-axis direction (the Y-axis direction) with their longitudinal directions oriented in the Y-axis direction (the X-axis direction). In inner space $35_0$, these X coil units 60X and Y coil units 60Y are alternately placed in the X-axis direction and the Y-axis direction.

In FIG. 3 and the other drawings, in accordance with the array pitch of coil units 60X and 60Y, a label "I" (=1 to 8) is allocated to sections disposed along the X-axis direction and a label "j" (=1 to 7) is allocated to sections disposed along the Y-axis direction. Coil units 60X and 60Y in the sections indicate by two labels "i" and "j" are expressed using reference signs $60X_{ij}$ and $60Y_{ij}$, respectively. For example, the Y coil unit placed on the most −X side and the most −Y side is expressed as Y coil unit $60Y_{11}$ and the X coil unit placed on the X side of Y coil unit $60Y_{11}$ is expressed as X coil unit $60x_{21}$. However, the coil units are generically described using reference signs 60X and 60Y unless a coil unit in any specific section is referred to.

X coil unit 60X (Y coil unit 60Y) configures a three-phase coil for generating a thrust in the X-axis direction (the Y-axis direction) by three armature coils 38X (38Y) arrayed in an upper section among six armature coils 38X (38Y) configuring X coil unit 60X (Y coil unit 60Y). These three coils are referred to as a U coil $38X_U$ ($38Y_U$), a V coil $38X_V$ ($38Y_V$) and a W coil $38X_W$ ($38Y_W$) in the arrayed order (see FIGS. 3 and 4). However, they are generically described using a reference sign 38X (38Y) unless any specific armature coil of the three-phase coil is referred to.

Further, X coil unit 60X (Y coil unit 60Y) configures a three-phase coil for generating a thrust in the Z-axis direction by three armature coils 38X (38Y) arrayed in a lower section among the six armature coils 38X (38Y) configuring X coil unit 60X (Y coil unit 60Y). These three coils are referred to as an A coil $38X_A$ ($38Y_A$), a B coil $38X_B$ ($38Y_B$) and a C coil $38X_C$ ($38Y_C$) in the arrayed order (see FIGS. 3 and 4). However, they are generically described using a reference sign 38X (38Y) unless any specific armature coil of the three-phase coil is referred to.

Figure 5A:
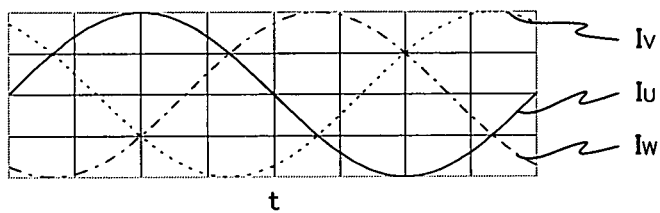
FIG. 5A is a view showing excitation currents of a U coil, a V coil and a W coil.
Figure 5B:
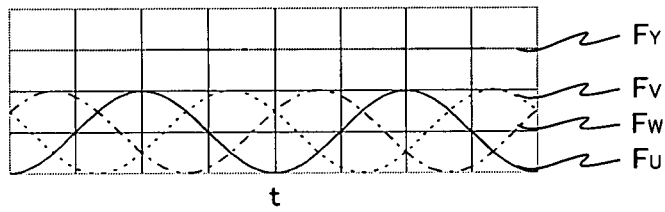
FIG. 5B is a view showing thrusts generated by the U coil, the V coil and the W coil and a resultant force of the thrusts.

FIG. 5A shows three-phase excitation currents $I_u$, $I_v$ and $I_w$ of the three-phase coil that configures armature coil 38X (38Y), i.e., U coil $38X_U$ ($38Y_U$), V coil $38X_V$ ($38Y_V$) and W coil $38X_W$ ($38Y_W$). Excitation currents $I_u$, $I_v$ and $I_w$ oscillate in the phase shifted by $2\pi/3$ in order. By supplying these excitation currents $I_u$, $I_v$ and $I_w$ to the U coil, the V coil and the W coil, respectively, the U coil, the V coil and the W coil respectively apply thrusts $F_u$, $F_v$ and $F_w$ in the X-axis direction (the Y-axis direction) shown in FIG. 5B, to the facing magnet units $55X_1$ and $55X_2$ ($55Y_1$ and $55Y_2$). Accordingly, X coil unit 60X (Y coil unit 60Y) applies a constant resultant force F (=$F_u+F_v+F_w$) in the X-axis direction (the Y-axis direction) to magnet units $55X_1$ and $55X_2$ ($55Y_1$ and $55Y_2$) for a time t.

Figure 5C:
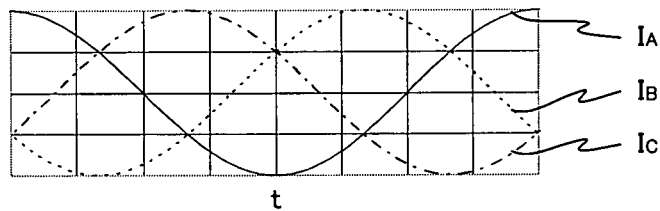
FIG. 5C is a view showing excitation currents of an A coil, a B coil and a C coil.
Figure 5D:
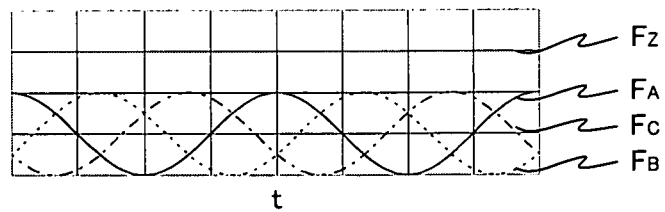
FIG. 5D is a view showing thrusts (levitation forces) generated by the A coil, the B coil and the C coil and a resultant force of the thrusts.

FIG. 5C shows three-phase excitation currents $I_A$, $I_B$ and $I_C$ of the three-phase coil that configures X coil unit 60X (Y coil unit 60Y), i.e., A coil $38X_A$ ($38Y_A$), B coil $38X_B$ ($38Y_B$) and C coil $38X_C$ ($38Y_C$). Excitation currents $I_A$, $I_B$, and $I_C$ oscillate in the phase shifted by $2\pi/3$ in order. By supplying these excitation currents $I_A$, $I_B$ and $I_C$ to the A coil, the B coil and the C coil, respectively, the A coil, the B coil and the C coil respectively apply thrusts $F_A$, $F_B$ and $F_C$ in the Z-axis direction shown in FIG. 5D, to the facing magnet units $55X_1$ and $55X_2$ ($55Y_1$ and $55Y_2$). Accordingly, X coil unit 60X (Y coil unit 60Y) applies a constant resultant force F (=$F_A+F_B+F_C$) in the Z-axis direction to magnet units $55X_1$ and $55X_2$ ($55Y_1$ and $55Y_2$) for a time t. Thus, wafer stage WST is supported by levitation above base board 12 via a clearance of around 100 µm.

As is described above, by exciting armature coil 38X (38Y) (by supplying the excitation current), X coil units 60X (Y coil units 60Y) configuring stator 60 function as a 2DOF motor that gives a driving force in the X-axis direction (the Y-axis direction) and the Z-axis direction to magnet units $55X_1$ and $55X_2$ configuring mover 50. In this case, by supplying different excitation currents to armature coils $38X_u$, $38X_v$ and $38X_w$ ($38Y_u$, $38Y_v$ and $38Y_w$) that configure another X coil unit 60X (Y coil unit 60Y) facing armature units $55X_1$ and $55X_2$ ($55Y_1$ and $55Y_2$), mover 51 is rotated in the θz direction with respect to stator 60. Further, by supplying different excitation currents to armature coils $38X_A$, $38X_B$ and $38X_C$ ($38Y_A$, $38Y_B$ and $38Y_C$) that configure another X coil unit 60X (Y coil unit 60Y) facing armature units $55X_1$ and $55X_2$ ($55Y_1$ and $55Y_2$), mover 51 is inclined in the θx direction and the θy direction with respect to stator 60. Accordingly, wafer stage WST can be driven in directions of six degrees of freedom by stage driving system 124.

Note that excitation currents (three-phase currents) $I_k$ (k=U, V, W) and $I_h$ (h=A, B, C) are respectively supplied to armature coils $38X_k$, $38Y_k$, $38X_h$ and $38Y_h$ severally configuring X coil unit 60X and Y coil unit 60Y, by an amplifier section (not shown) that configures stage driving system (planar motor) 124. The amplitudes of three-phase currents $I_k$ and $I_h$ are controlled by main controller 20 (see FIG. 10).

In the center of wafer table WTB, a wafer holder (not shown) that holds wafer W by vacuum suction or the like is provided. As shown in FIG. 2A, on the +Y side of the wafer holder (wafer W) on an upper surface of wafer table WTB, a measurement plate 30 is provided. On measurement plate 30, a fiducial mark FM is provided in the center and a pair of aerial image measurement slit patterns (slit-shaped patterns for measurement) SL are provided on both sides of fiducial mark FM in the X-axis direction. Then, corresponding to each aerial image measurement slit pattern SL, an optical system and a light-receiving element, and the like are placed inside wafer table WTB. That is, on wafer table WTB, a pair of aerial image measurement devices 45A and 45B (see FIG. 10) including aerial image measurement slit patterns SL are provided.

Further, on the upper surface of wafer table WTB, scales that are used in an encoder system, which will be described later, are formed. To describe in detail, in areas on one side and the other side in the X-axis direction (a lateral direction on the page surface of FIG. 2A) on the upper surface of wafer table WTB, Y scales $39Y_1$ and $39Y_2$ are formed, respectively. Y scales $39Y_1$ and $39Y_2$ are configured with reflection type gratings (e.g., diffraction gratings) having a periodic direction in the Y-axis direction, in which grid lines 38 with their longitudinal directions being in the X-axis direction are arrayed in the Y-axis direction at a predetermined pitch.

Similarly, in areas on one side and the other side in the Y-axis direction (a vertical direction on the page surface of FIG. 2A) on the upper surface of wafer table WTB, X scales $39X_1$ and $39X_2$ are respectively formed in a state sandwiched between Y scales $39Y_1$ and $39Y_2$. X scales $39X_1$ and $39X_2$ are configured with reflection type gratings (e.g., diffraction gratings) having a periodic direction in the X-axis direction, in which grid lines 37 with their longitudinal directions being in the Y-axis direction are arrayed in the X-axis direction at a predetermined pitch.

Note that the pitch of grid lines 37 and 38 is set, for example, at 1 µm. In FIG. 2A and the other drawings, the pitch of the gratings is shown larger than the actual pitch, for the sake of illustrative convenience.

Further, it is also effective to cover the diffraction grating with a glass plate of a low coefficient of thermal expansion, in order to protect the diffraction grating. In this case, as the glass plate, the one having a thickness comparable to the thickness of the wafer, e.g., a thickness of 1 mm can be used, and the glass plate is installed on the upper surface of wafer table WTB so that a surface of the glass plate is at the same height as (is flush with) the wafer surface.

Further, on a −Y edge surface and a −X edge surface of wafer table WTB, as shown in FIG. 2A, a reflection surface 17a and a reflection surface 17b used in an interferometer system, which will be described later, are formed.

Further, to a +Y side surface of wafer table WTB, as shown in FIG. 2A, a fiducial bar (hereinafter, referred to as an "FD bar" for short) 46 extending in the X-axis direction is attached, which is similar to the CD bar disclosed in U.S. Application Publication No. 2008/0088843. In the vicinity of ends on one side and the other side in the longitudinal direction of FD bar 46, reference gratings (e.g., diffraction gratings) 52 having a periodic direction in the Y-axis direction are formed in a placement symmetric with respect to a centerline LL. Further, on an upper surface of FD bar 46, a plurality of reference marks M are formed. As each reference mark M, a two-dimensional mark having a size detectable by alignment systems, which will be described later, is used.

Figure 7:
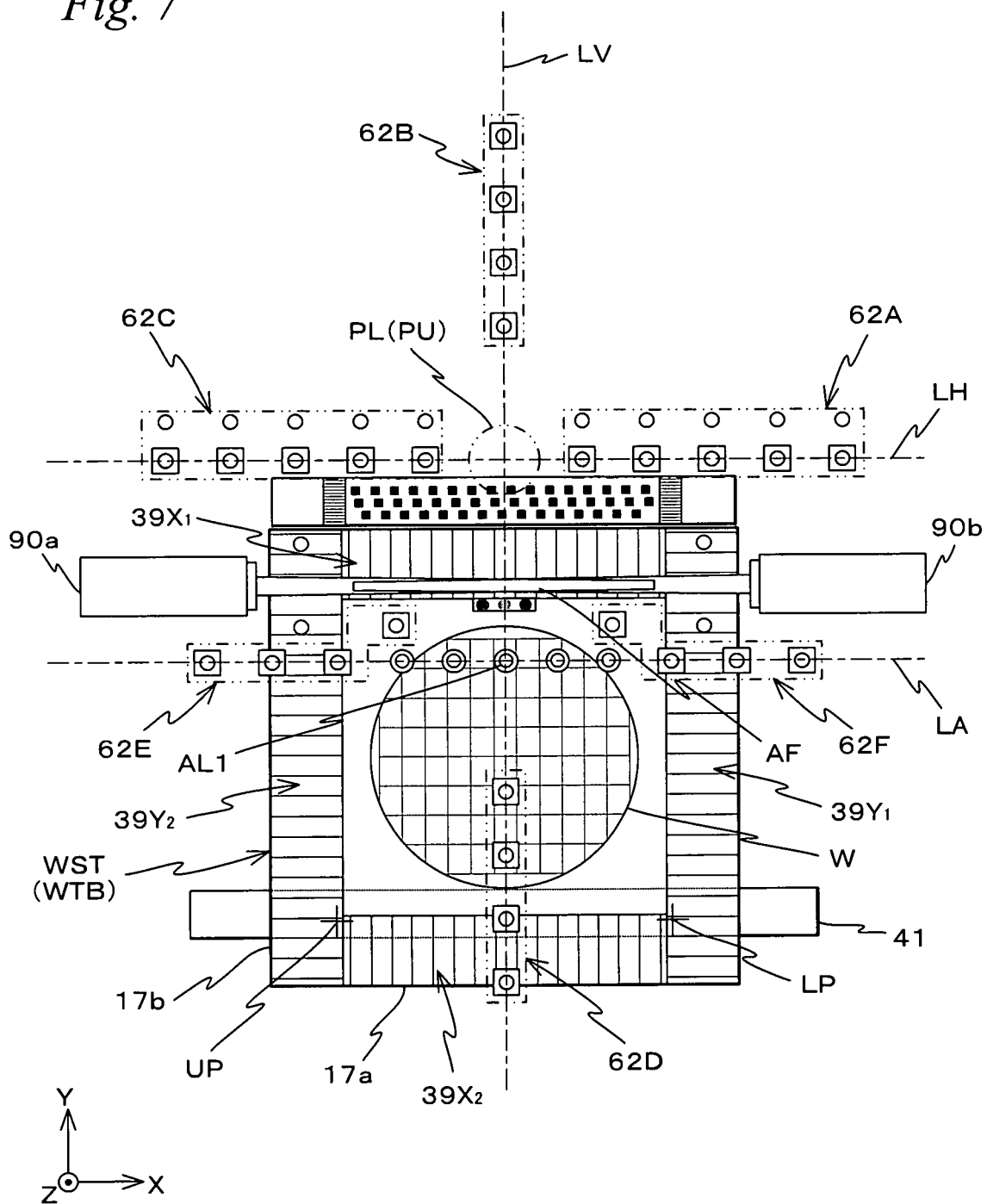
FIG. 7 is a plan view showing a placement of the stage device and a sensor unit.
Figure 8:
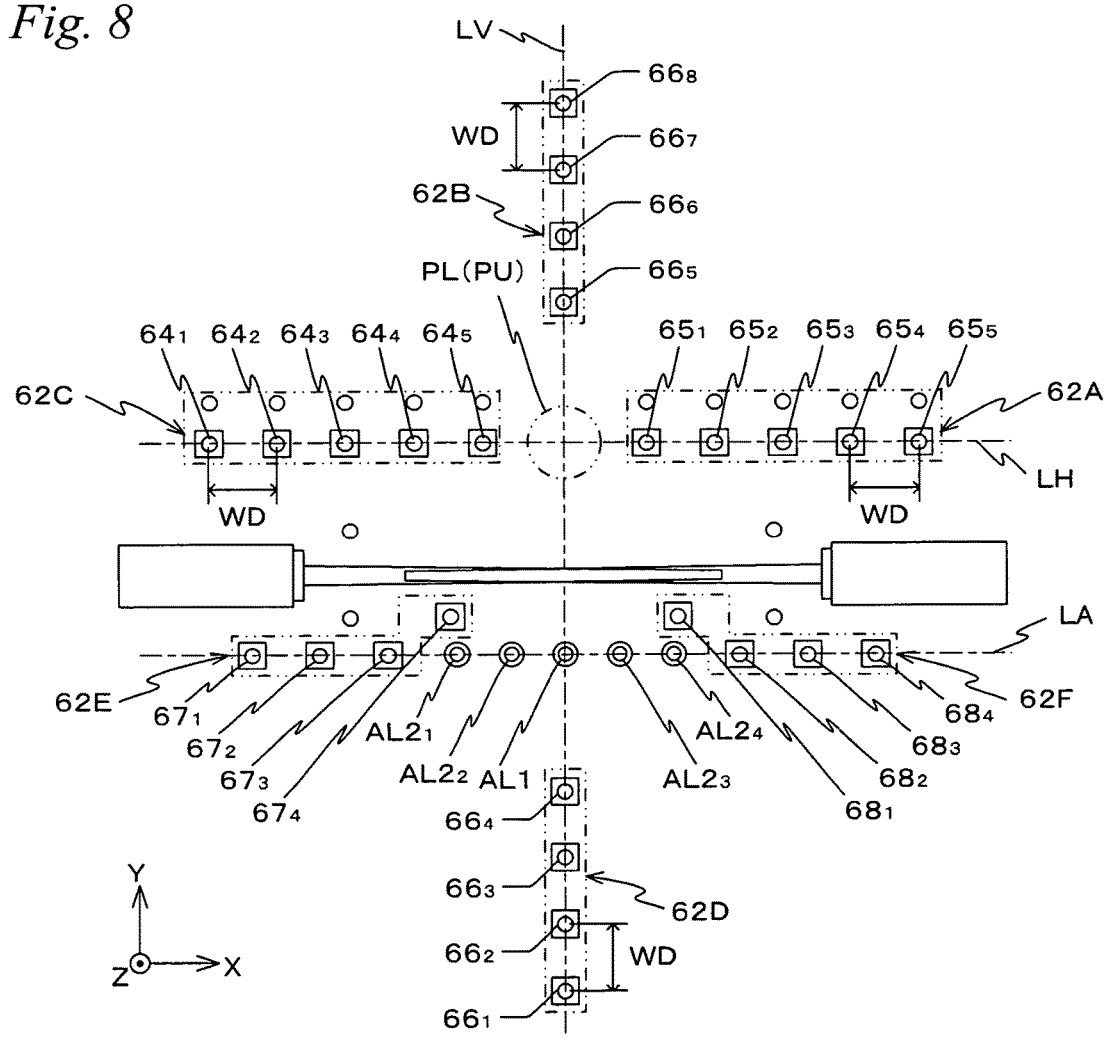
FIG. 8 is a plan view showing a placement of encoder heads (X heads, Y heads) and alignment systems.

In exposure apparatus 100 of the present embodiment, as shown in FIGS. 7 and 8, primary alignment system AL1, which has a detection center at a position a predetermined distance apart from optical axis AX to the −Y side, is placed on a straight line (hereinafter, referred to as a reference axis) LV parallel to the Y-axis and connecting optical axis AX of projection optical system PL and the detection center of primary alignment system AL1. Primary alignment system AL1 is fixed to a lower surface of a main frame that is not shown. As shown in FIG. 8, secondary alignment systems $AL2_1$ and $AL2_2$ and secondary alignment systems $AL2_3$ and $AL2_4$, detection centers of which are placed substantially symmetrically with respect to reference axis LV, are provided on one side and the other side in the X-axis direction, respectively, with primary alignment system AL1 in between. Secondary alignment systems $AL2_1$ to $AL2_4$ are fixed to the lower surface of the main frame (not shown) via a movable support member, and relative positions of their detection areas are adjustable in the X-axis direction by driving mechanisms $60_1$ to $60_4$ (see FIG. 10).

In the present embodiment, as each of alignment systems AL1 and $AL2_1$ to $AL2_4$, for example, an FIA (Field Image Alignment) system of an imager processing method is used. An imaging signal from each of alignment systems AL1 and $AL2_1$ to $AL2_4$ is supplied to main controller 20 via a signal processing system that is not shown.

Figure 6:
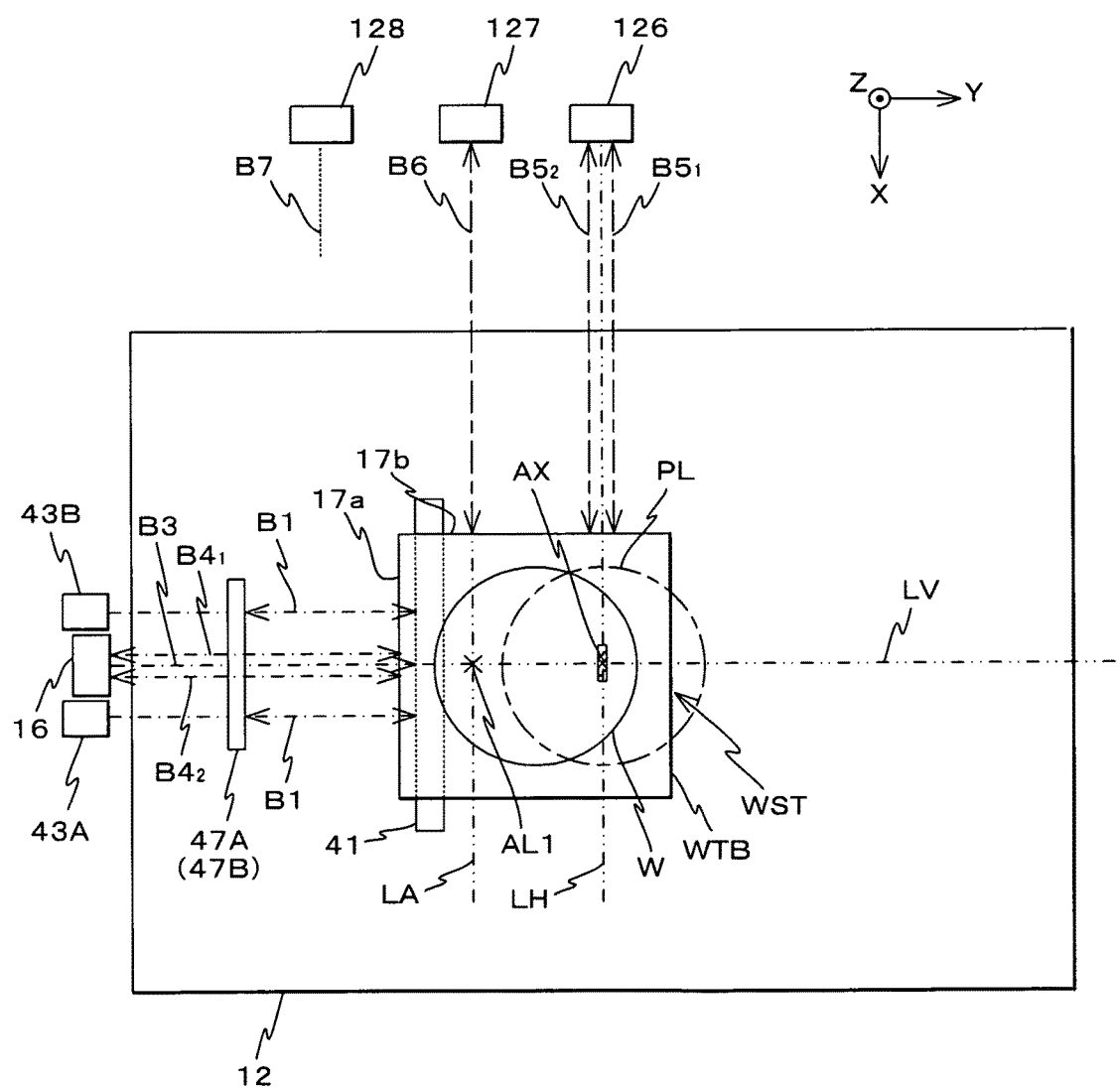
FIG. 6 is a plan view showing a placement of the stage device and interferometers.

As shown in FIG. 6, interferometer system 118 is equipped with a Y interferometer 16, three X interferometers 126 to 128 and a pair of Z interferometers 43A and 43B that measure the position of wafer stage WST within the XY plane by each irradiating an interferometer beam (a measurement beam) on reflection surface 17a or 17b and receiving the reflected beam of the interferometer beam. To describe in detail, Y interferometer 16 irradiates reflection surface 17a and a movable mirror 41 to be described later, with at least three measurement beams parallel to the Y-axis that include a pair of measurement beams $B4_1$ and $B4_2$ symmetric with respect to reference axis LV. Further, as shown in FIG. 6, X interferometer 126 irradiates reflection surface 17b, with at least three measurement beams parallel to the X-axis that include a pair of measurement beams $B5_1$ and $B5_2$ symmetric with respect to a straight line (hereinafter, referred to as a reference axis) LH parallel to the X-axis and orthogonal to optical axis AX and reference axis LV. Further, X interferometer 127 irradiates reflection surface 17b with at least two measurement beams parallel to the X-axis that include a measurement beam B6 having a measurement axis in a straight line (hereinafter, referred to as a reference axis) LA parallel to the X-axis and orthogonal to reference axis LV at the detection center of alignment system AL1. Further, X interferometer 128 irradiates reflection surface 17b with a measurement beam B7 parallel to the X-axis.

Positional information from the respective interferometers described above of interferometer system 118 is supplied to main controller 20. Based on measurement results of Y interferometer 16 and X interferometer 126 or 127, main controller 20 can also calculate rotation information in the θx direction (i.e., pitching), rotation information in the θy direction (i.e., rolling) and rotation information in the θz direction (i.e., yawing) of wafer table WTB (wafer stage WST), in addition to the X position and the Y position of wafer table WTB (wafer stage WST).

Further, as shown in FIG. 1, movable mirror 41 having a reflection surface of a concave shape is attached to a side surface on the −Y side of stage main body 91. As can be seen from FIG. 2A, movable mirror 41 has a length in the X-axis direction longer than that of reflection surface 17a of wafer table WTB.

The pair of Z interferometers 43A and 43B that configure a part of interferometer system 118 (see FIG. 10) are provided facing movable mirror 41 (see FIGS. 1 and 6). Z interferometers 43A and 43B irradiate fixed mirrors 47A and 47B fixed to, for example, a frame (not shown) that supports projection unit PU, with two measurement beams B1 and B2 parallel to the Y-axis, respectively. Then, Z interferometers 43A and 43B receive the reflected beams of the respective measurement beams, and thereby measure the optical path lengths of measurement beams B1 and B2. From their results, main controller 20 calculates the position of wafer stage WST in directions of four degrees of freedom (Y, Z, θy, θz).

In exposure apparatus 100 of the present embodiment, independently from interferometer system 118, a plurality of head units that configure encoder system 150 are provided to measure the position within the XY plane (X, Y, θz) of wafer stage WST.

As shown in FIG. 7, on the +X side, the +Y side and the −X side of projection unit PU and the −Y side of primary alignment system AL1, four heads units 62A, 62B, 62C and 62D are placed, respectively. Further, on both of outer sides of alignment systems AL1 and $AL2_1$ to $AL2_4$ in the X-axis direction, head units 62E and 62F are provided, respectively. Head units 62A to 62F are fixed in a suspended state, via a support member, to the main frame (not shown) that holds projection unit PU. Note that, in FIG. 7, a reference sign UP represents an unloading position at which the unloading of a wafer on wafer stage WST is performed, and a reference sign LP represents a loading position at which the loading of a new wafer onto wafer stage WST is performed.

As shown in FIG. 8, head units 62A and 62B are equipped with a plurality (herein, five) of Y heads $65_1$ to $65_5$ and a plurality (herein, five) of Y heads $64_1$ to $64_5$, respectively, that are placed at a predetermined distance on a reference axis LH described earlier. In the description below, Y heads $65_1$ to $65_5$ and Y heads $64_1$ to $64_5$ are also described as Y heads 65 and Y heads 64, respectively, as needed.

Heads units 62A and 62C configure multiple-lens Y linear encoders 70A and 70C (see FIG. 10), respectively, that measure the position in the Y-axis direction (the Y position) of wafer stage WST (wafer table WTB), using Y scales $39Y_1$ and $39Y_2$. Incidentally, in the description below, the Y linear encoders are referred to as "Y encoders" or "encoders" for short, where appropriate.

As shown in FIG. 8, head unit 62B is placed on the +Y side of projection unit PU, and is equipped with a plurality (herein, four) of X heads $66_5$ to $66_8$ placed at a distance WD on reference axis LV. Further, head unit 62D is placed on the −Y side of primary alignment system AL1, and is equipped with a plurality (herein, four) of X heads $66_1$ to $66_4$ placed at a distance WD on reference axis LV. In the description below, X heads $66_5$ to $66_8$ and X heads $66_1$ to $66_4$ are also described as X heads 66, as needed.

Heads units 62B and 62D configure multiple-lens X linear encoders 70B and 70D (see FIG. 10), respectively, that measure the position in the X-axis direction (the X position) of wafer stage WST (wafer table WTB), using X scales $39X_1$ and $39X_2$. Incidentally, in the description below, the X linear encoders are referred to as "X encoders" or "encoders" for short, where appropriate.

In this case, distance WD in the X-axis direction of five Y heads 65 and 64 (to be more accurate, irradiation points on the scales of the measurement beams emitted from Y heads 65 and 64) equipped respectively in head units 62A and 62C is set so that at least one head constantly faces (irradiates the measurement beam on) the corresponding Y scales $39Y_1$ and $39Y_2$ when exposure or the like is performed. Similarly, distance WD in the Y-axis direction of X heads 66 (to be more accurate, irradiation points on the scales of the measurement beams emitted from X heads 66) equipped respectively in head units 62B and 62D is set so that at least one head constantly faces (irradiates the measurement beam on) the corresponding X scale $39X_1$ or $39X_2$ when exposure or the like is performed. Therefore, for example, in one state during an exposure operation shown in FIG. 11A, Y heads $65_3$ and $64_3$ respectively face (irradiate the measurement beams on) Y scales $39Y_1$ and $39Y_2$, and X head $66_5$ faces (irradiates the measurement beam on) X scale $39X_1$.

Note that the distance between X head $66_5$ on the most −Y side of head unit 62B and X head $66_4$ on the most +Y side of head unit 62D is set shorter than a width of wafer table WTB in the Y-axis direction so that the switching (linkage) between the two X heads can be performed by movement of wafer stage WST in the Y-axis direction.

As shown in FIG. 8, head unit 62E is equipped with a plurality (herein, four) of Y heads $67_1$ to $67_4$.

Head unit 62F is equipped with a plurality (herein, four) of Y heads $68_1$ to $68_4$. Y heads $68_1$ to $68_4$ are placed at positions symmetrical to Y heads $67_4$ to $67_1$ with respect to reference axis LV. In the description below, Y heads $67_4$ to $67_1$ and Y heads $68_1$ to $68_4$ are also described as Y heads 67 and Y heads 68, respectively, as needed.

When alignment measurement is performed, at least one of Y heads 67 and at least one of Y heads 68 face Y scales $39Y_2$ and $39Y_1$, respectively. For example, in one state during the alignment measurement shown in FIG. 11B, Y heads $67_3$ and $68_2$ face Y scales $39Y_2$ and $39Y_1$, respectively. The Y position (and the θz rotation) of wafer stage WST is/are measured by Y heads 67 and 68 (i.e., Y encoders 70E and 70F configured with Y heads 67 and 68).

Further, in the present embodiment, when the baseline measurement of the secondary alignment systems or the like is performed, Y heads $67_3$ and $68_2$ adjacent to secondary alignment systems $AL2_1$ and $AL2_4$ in the X-axis direction face a pair of reference gratings 52 of FD bar 46, and the Y position of FD bar 46 is measured by Y heads $67_3$ and $68_2$ that face that pair of reference gratings 52, at the respective positions of reference gratings 52. In the description below, encoders configured with Y heads $67_3$ and $68_2$ that face a pair of reference gratings 52, respectively, are referred to as Y linear encoders $70E_2$ and $70F_2$ (see FIG. 10). Further, Y encoders configured with Y heads 67 and 68 that face Y scales $39Y_2$ and $39Y_1$ are referred to Y encoders $70E_1$ and $70F_1$ to be distinguishable.

The measurement values of encoders 70A to 70F described above are supplied to main controller 20. Main controller 20 calculates the position (X, Y, θz) within the XY plane of wafer stage WST, based on the measurement values of three of encoders 70A to 70D, or three of encoders $70E_1$, $70F_1$, 70B and 70D. In this case, the measurement values (expressed as $C_X$, $C_{Y1}$ and $C_{Y2}$, respectively) of X head 66 and Y heads 65 and 64 (or 68 and 67) are dependent on the position (X, Y, θz) of wafer stage WST as follows.

$$C_X = (P_X - X)\cos\theta z + (q_X - Y)\sin\theta z, \quad (1a)$$

$$C_{Y1} = -(P_{Y1} - X)\sin\theta z + (q_{Y1} - Y)\cos\theta z, \quad (1b)$$

$$C_{Y2} = -(P_{Y2} - X)\sin\theta z + (q_{Y2} - Y)\cos\theta z. \quad (1c)$$

In this case, $(P_X, q_X)$, $(P_{Y1}, q_{Y1})$ and $(P_{Y2}, q_{Y2})$ are the X and Y installing positions (to be more accurate, the X and Y positions of irradiation points of the measurement beams) of X head 66, Y head 65 (or 68) and Y head 64 (or 67), respectively. Then, by assigning the measurement values $C_X$, $C_{Y1}$ and $C_{Y2}$ of the three heads into the simultaneous equations (1a) to (1c) and solving them, the position (X, Y, θz) within the XY plane of wafer stage WST is calculated. Based on the calculation results, wafer stage WST is driven and controlled.

Further, main controller 20 controls the rotation in the θz direction of FD bar 46 (wafer stage WST) based on the measurement values of linear encoders $70E_2$ and $70F_2$. In this case, the measurement values (respectively expressed as $C_{Y1}$ and $C_{Y2}$) of linear encoders $70E_2$ and $70F_2$ are dependent on the (X, Y, θz) positions of FD bar 46 as in the equations (1b) and (1c). Accordingly, the θz position of FD bar 46 is obtained as follows by the measurement values $C_{Y1}$ and $C_{Y2}$.

$$\sin\theta z = -(C_{Y1} - C_{Y2})/(P_{Y1} - P_{Y2}). \quad (2)$$

In this case, $q_{Y1} = q_{Y2}$ is assumed for simplification.

Note that, as each encoder head (Y head, X head), for example, an interference type encoder head disclosed in U.S. Application Publication No. 2008/0088843 can be used. In this type of encoder head, two measurement beams are irradiated on the corresponding scales, the respective return beams are synthesized into one interference light and received, and the intensity of the interference light is measured using a photodetector. With the intensity change of the interference light, the displacement of the scale in the measurement direction (the periodic direction of the diffraction grating) is measured.

Figure 9:
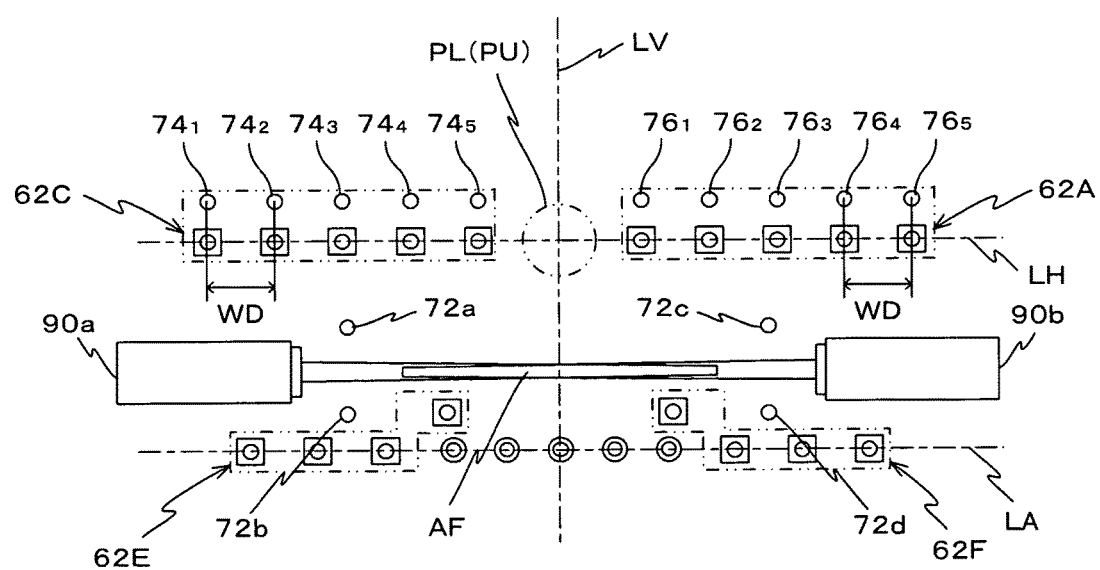
FIG. 9 is a plan view showing a placement of Z heads and a multi-point AF system.

Moreover, in exposure apparatus 100 of the present embodiment, as shown in FIGS. 7 and 9, a multi-point focal position detecting system (hereinafter, referred to as a "multi-point AF system" for short) composed of an irradiation system 90*a* and a light-receiving system 90*b* is provided. As the multi-point AF system, for example, a multi-point AF system of an oblique incidence method having a configuration similar to the one disclosed in U.S. Pat. No. 5,448,332 and the like is employed. In the present embodiment, as one example, irradiation system 90*a* is placed on the +Y side of an −X end of head unit 62E described earlier, and light-receiving system 90*b* is placed on the +Y side of a +X end of head unit 62F described earlier, in a state of facing irradiation system 90*a*. Note that the multi-point AF system (90*a*, 90*b*) is fixed to the lower surface of the main frame that holds projection unit PU.

In FIGS. 7 and 9, a plurality of detection points each irradiated by a detection beam are not individually shown, but are shown in an elongate detection area (a beam area) AF extending in the X-axis direction between irradiation system 90*a* and light-receiving system 90*b*. Since the length in the X-axis direction of detection area AF is set at around the same length as the diameter of wafer W, positional information in the Z-axis direction (surface position information) on substantially the entire surface of wafer W can be measured by scanning wafer W in the Y-axis direction only once.

As shown in FIG. 9, in the vicinity of both ends of detection area AF of the multi-point AF system (90*a*, 90*b*), a pair of Z position measurement heads (hereinafter, referred to as "Z heads" for short) 72*a* and 72*b* and a pair of Z position measurement heads (hereinafter, referred to as "Z heads" for short) 72*c* and 72*d*, which configure a part of surface position sensor system 180, are provided in a placement symmetric with respect to reference axis LV. These heads 72*a* to 72*d* are fixed to the lower surface of the main frame that is not shown.

As Z heads 72*a* to 72*d*, for example, heads of an optical displacement sensor similar to an optical pickup used in a CD drive device or the like are used. Z heads 72*a* to 72*d* irradiate measurement beams from above to wafer table WTB, receive reflected beams of the measurement beams, and thereby measure the surface position of wafer table WTB at the irradiation points. Note that, in the present embodiment, a configuration is employed in which the measurement beams of the Z heads are reflected by the refection type diffraction gratings configuring Y scales $39Y_1$ and $39Y_2$ described earlier.

Furthermore, as shown in FIG. 9, head units 62A and 62C described earlier are equipped with five Z heads $76_j$ and $74_i$ (i, j=1 to 5), respectively, at the same X positions as the five Y heads $65_j$ and $64_i$ (i, j=1 to 5), but with the Y positions being shifted. And, five Z heads $76_j$ and five Z heads $74_i$ that belong to head units 62A and 62C, respectively, are placed symmetrically to each other with respect to reference axis LV. Note that as each of heads $76_j$ and $74_i$, a head of an optical displacement sensor similar to Z heads 72*a* to 72*d* described earlier is employed.

As shown in FIG. 10, Z heads 72*a* to 72*d*, $74_1$ to $74_5$ and $76_1$ to $76_5$ described above are coupled to main controller 20 via a signal processing/selection device 170, and main controller 20 selects an arbitrary Z head out of Z heads 72*a* to 72*d*, $74_1$ to $74_5$ and $76_1$ to $76_5$, via signal processing/selection device 170, to make it into an active state, and receives the surface position information detected by the Z head that has been made into the active state via signal processing/selection device 170. In the present embodiment, surface position sensor system 180 that measures positional information of wafer stage WST in the Z-axis direction and in a tilt direction with respect to the XY plane is configured including Z heads 72*a* to 72*d*, $74_1$ to $74_5$ and $76_1$ to $76_5$ and signal processing/selection device 170.

In the present embodiment, main controller 20 measures the position coordinate in directions of two degrees of freedom (Z, θy) of wafer stage WST using surface position sensor system 180 (see FIG. 10), in an effective stroke area of wafer stage WST, i.e., in an area in which wafer stage WST moves for exposure and alignment measurement.

When exposure is performed, main controller 20 calculates a height $Z_0$ and the rolling θy of wafer stage WST at a reference point on the table surface (an intersecting point of the table surface and optical axis AX), using the measurement values of at least one Z head $76_j$ and at least one Z head $74_i$ (j and i are each any one of 1 to 5). In one state during an exposure operation shown in FIG. 11A, main controller 20 uses the measurement values of Z heads $76_3$ and $74_3$ that face Y scales $39Y_1$ and $39Y_2$, respectively. In this case, the measurement values (each expressed as $Z_1$ and $Z_2$) of Z heads $76_j$ and $74_i$ (j and i are each any one of 1 to 5) are dependent on the position ($Z_0$, θx, θy) of wafer stage WST as follows.

$$Z_1 = -\tan\theta y \cdot p_1 + \tan\theta x \cdot q_1 + Z_0, \quad (3a)$$

$$Z_2 = -\tan\theta y \cdot p_2 + \tan\theta x \cdot q_2 + Z_0. \quad (3b)$$

In this case, the upper surface of wafer table WTB including the scale surface is assumed to be an ideal plane. Note that ($p_1$, $q_1$) and ($p_2$, $q_2$) are the X and Y installation positions (to be more accurate, the X and Y positions of irradiation points of the measurement beams) of Z heads $76_j$ and $74_i$, respectively. The following equations (4a) and (4b) are derived from the equations (3a) and (3b).

$$Z_0 = [Z_1 + Z_2 - \tan\theta x \cdot (q_1 + q_2)]/2, \quad (4a)$$

$$\tan\theta y = [Z_1 - Z_2 - \tan\theta x \cdot (q_1 - q_2)]/(p_1 + p_2). \quad (4b)$$

Accordingly, main controller 20 calculates the height $Z_0$ and the rolling θy of wafer stage WST from the equations (4a) and (4b), using measurement values $Z_1$ and $Z_2$ of Z heads $76_j$ and $74_i$. With regard to the pitching θx, however, the measurement results of another sensor system (interferometer system 118 in the present embodiment) are used.

Figure 12:
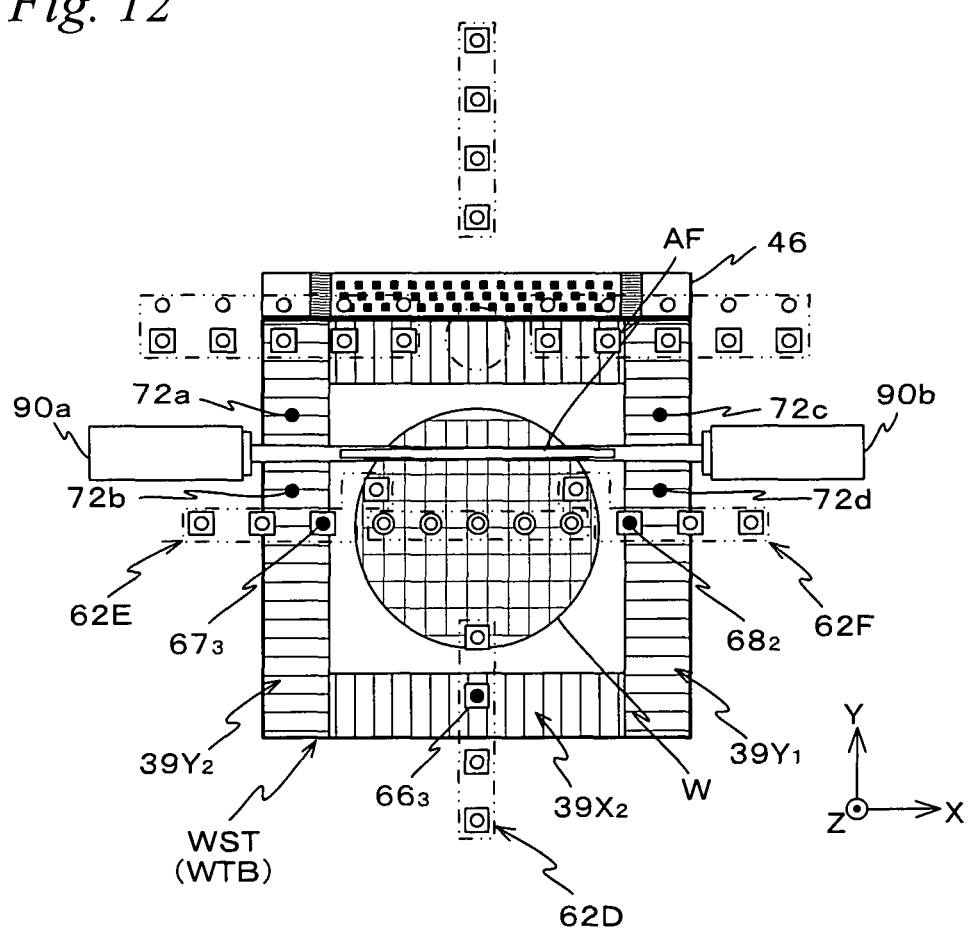
FIG. 12 is a view used to explain position measurement of the wafer stage using the Z heads during a focus mapping and a focus calibration.

When the focus calibration and the focus mapping as shown in FIG. 12 are performed, main controller 20 calculates as follows the height $Z_0$ and the rolling θy of wafer table WTB at the center (X, Y)=(Ox', Oy') of a plurality of detection points of the multi-point AF system (90a, 90b), using the measurement values (respectively expressed as Za, Zb, Zc and Zd) of the four Z heads 72a to 72d that face Y scales $39Y_1$ and $39Y_2$.

$$Z_0 = (Za+Zb+Zc+Zd)/4, \quad (5a)$$

$$\tan\theta y = -(Za+Zb-Zc-Zd)/(p_a+p_b-p_c+p_d). \quad (5b)$$

Herein, ($p_a$, $q_a$), ($p_b$, $q_b$), ($p_c$, $q_c$) and ($p_d$, $q_d$) are the X and Y installation positions (to be more accurate, the X and Y positions of irradiation points of the measurement beams) of Z heads 72a to 72d, respectively. In this case, $p_a=P_b$, $p_c=p_d$, $q_a=q_c$, $q_b=q_d$, $(p_a+p_c)/2=(p_b+p_d)/2=Ox'$, and $(q_a+q_b)/2=(q_c+q_d)/2=Oy'$ are satisfied. Note that, as is described previously, with regard to the pitching θx, the measurement results of another sensor system (interferometer system 118 in the present embodiment) are used.

FIG. 10 shows a main configuration of the control system of exposure apparatus 100. This control system is configured with main controller 20, as the center, that is composed of a microcomputer (or a workstation) that performs overall control of the entire apparatus.

In the exposure apparatus of the present embodiment configured as described above, for example, according to the procedures similar to those disclosed in the embodiment of U.S. Patent Application Publication No. 2008/0088843, the processing of typical sequence using wafer stage WST is executed by main controller 20.

Next, the driving and control of wafer stage WST at the time of abnormality will be described.

In encoder system 150 and surface position sensor system 180 mounted in exposure apparatus 100 of the present embodiment, it is considered that abnormality occurs in measurement results of the encoders and the Z sensors, for example, by detecting foreign substances adhering to the scale surface. Herein, the measurement beam of the encoder has, for example, a spread of 2 mm in a measurement direction and 50 μm in a grid line direction on a reflection surface. While the measurement beam of the Z sensor is condensed in a range of a several μm on a diffraction grating surface serving as a reflection surface, it spreads to a range of around a submillimeter on a scale surface, in accordance with the numerical aperture. Accordingly, small foreign substances can also be detected. Further, from the actual viewpoint, it is impossible to completely prevent for a long period of time the mixture into the apparatus and the adhesion to a scale surface of foreign substances. Further, such a situation can also be considered that the encoder or the z sensor breaks down and the output thereof ceases.

Further, for example, in the liquid immersion exposure apparatus disclosed in U.S. Patent Application Publication No. 2008/0088843, there is the possibility that the water droplets cannot be recovered and remain on the scale surface. Such water droplets may be a source of generating abnormality of the measurement results of the encoder and the Z sensor. In this case, when the encoder and the Z sensor detect the water droplets, the beam intensity is decreased because the measurement beam is intercepted by the water droplets and then the output signal ceases. Further, since the substrate having a different refraction index is detected, it is considered that the linearity of the measurement results with respect to the displacement of wafer stage WST is decreased.

Main controller 20 collects the output signals of encoders 70A to 70F (X heads and Y heads 64 to 68) and Z heads $76_j$ and $74_i$ and the like that configure encoder system 150 and surface position sensor system 180, with respect to each occurrence of a measurement clock (e.g., 10 μsec). Main controller 20 calculates the position of wafer stage WST using the output signals collected with respect to each occurrence of a control clock (e.g., 100 μsec), and based on the calculation result, determines a driving target of wafer stage WST. The driving target that has been determined is transmitted to stage driving system 124, and wafer stage WST is driven by stage driving system 124 according to the target.

In this case, if the abnormality occurs in the measurement results of the encoder and the Z sensor as is described above, then when the position of wafer stage WST is calculated, i.e., when the position (X, Y, Oz) within the XY plane of wafer stage WST is calculated from the measurement values of encoders 70A to 70F using the equations (1a) to (1c), and when the height $Z_0$ and the rolling θy of wafer stage WST are calculated from the measurement values of Z heads $76_j$ and $74_i$ using the equations (4a) and (4b), the calculations fail and therefore the position of wafer stage WST cannot be obtained or the (incorrect) results including big errors are obtained, and then the driving target of wafer stage WST cannot be determined or the incorrect driving target is determined. If the driving target is not determined, then wafer stage WST cannot be controlled, and therefore, main controller 20 brings wafer stage WST to an emergency stop by, for example, applying a dynamic brake on wafer stage WST or causing wafer stage WST to collide against a shock absorber or the like. Further, if the incorrect driving target is determined, then wafer stage WST is driven and controlled by stage driving system 124 according to the incorrect driving target. Therefore, wafer stage WST will undergo exponential acceleration/deceleration.

In the case of planar motor (stage driving system) 124 of a magnetic levitation method in exposure apparatus 100 of the present embodiment, a driving point on which a driving force acts (the bottom part of wafer stage WST at which mover 51 is provided) is spaced apart from the center of gravity of wafer stage WST. Therefore, if wafer stage WST undergoes exponential acceleration/deceleration as is described above, then the pitching (the rotation tilted forward) is generated due to an inertial force, which may cause the upper surface of wafer stage WST (wafer table WTB) to collide with encoders 70A to 70F (X heads and Y heads 64 to 68) and Z heads $76_j$ and $74_i$ placed immediately above the upper surface, and further, in the case of a liquid immersion exposure apparatus, to collide with a liquid immersion device and the like such as a nozzle to supply an immersion liquid to a liquid immersion space between a projection optical system and a wafer, and may damage X scales $39X_1$ and $39X_2$ and Y scales $39Y_1$ and $39Y_2$ in particular.

Therefore, in the case of having detected the abnormality of the driving and control of wafer stage WST including the abnormality of encoder system 150 and surface position sensor system 180 as described above, main controller 20 applies a thrust in a vertical direction to wafer stage WST by controlling planar motor (stage driving system) 124, in order to avoid the pitching of wafer stage WST as described above.

Main controller 20 detects the abnormality of encoder system 150 and surface position sensor system 180, from the ceasing of the output signals from encoders 70A to 70F (X heads and Y heads 64 to 68) and Z heads $76_j$ and $74_i$ and the like that configure encoder system 150 and surface position sensor system 180, the exponential temporal change of their measurement results, and the deviation of the measurement results from measurement results of another sensor system, and the like.

Main controller 20 collects the output signals of encoders 70A to 70F (X heads and Y heads 64 to 68) and Z heads $76_j$ and $74_i$ and the like that configure encoder system 150 and surface position sensor system 180, with respect to each occurrence of the measurement clock having a period shorter than that of the control clock as is described earlier. Accordingly, prior to occurrence of the control clock, i.e., prior to the driving and control of wafer stage WST, main controller 20 can detect the ceasing of the output signals.

Further, main controller 20 calculates the position of wafer stage WST using the output signals collected with respect to each occurrence of the measurement clock, and compares the calculation results with calculation results obtained at the time of occurrence of the previous measurement clock. From this comparison, main controller 20 judges that the abnormality has occurred in encoder system 150 and surface position sensor system 180, in the case where it is judged that the position of wafer stage WST has changed significantly at an extraordinary level, taking the actual driving velocity of the stage into consideration. Alternatively, main controller 20 compares the calculation results of the position with the driving target obtained at the time of occurrence of the previous measurement clock (or before occurrence of the current measurement clock), and if the deviation between them exceeds a predetermined permissible range, then main controller 20 judges that the abnormality has occurred in encoder system 150 and surface position sensor system 180. Or, from the calculation results of the position of wafer stage WST, main controller 20 predicts, for example, the measurement values of individual encoders 70A to 70F (X heads and Y heads 64 to 68) and Z heads $76_j$ and $74_i$ and the like at the time of occurrence of the next measurement clock, and if the deviation of the actual measurement values from the predicted measurement values exceeds a predetermined permissible range, then main controller 20 judges that the abnormality has occurred in encoder system 150 and surface position sensor system 180.

Further, in the present embodiment, independently from the position measurement of wafer stage WST using encoder system 150 and surface position sensor system 180, the position measurement using interferometer system 118 is performed in the entire stroke area. Therefore, main controller 20 calculates the position of wafer stage WST from the output signals of encoder system 150 and surface position sensor system 180 as well as calculating the position of wafer stage WST from the measurement results of interferometer system 118, and compares theses calculation results. If the deviation between them exceeds a predetermined permissible range, then main controller 20 judges that the abnormality has occurred in encoder system 150 and surface position sensor system 180.

The abnormality of the driving and control of wafer stage WST can also be detected using a magnetic sensor (not shown) such as a Hall device arranged in base board 12 (stator 60). The magnetic sensor (not shown) is used to detect a magnetic field (strength) induced by the magnets configuring mover 51 (magnet units $55X_1$, $55X_2$, $55Y_1$, $55Y_2$) of wafer stage WST, and obtain the array of the magnets. In this case, detecting the magnetic field (strength) induced by the magnets corresponds to measuring a separation distance between the magnets, i.e., wafer stage WST and the upper surface of base board 12. Accordingly, the magnetic sensor (not shown) can also be used as a gap sensor that measures a separation distance between wafer stage WST and the upper surface of base board 12. Therefore, main controller 20 drives and controls wafer stage WST, and also collects the output of the magnetic sensor (not shown) with respect to each occurrence of the measurement clock, and if the separation distance between wafer stage WST and the upper surface of base board 12 (or the magnetic field strength that is the output of the magnetic sensor) exceeds a predetermined permissible range, then main controller 20 detects the abnormality of the driving and control of wafer stage WST, assuming that the pitching of wafer stage WST has occurred.

When main controller 20 detects the abnormality of the driving and control of wafer stage WST that includes the abnormality of encoder system 150 and surface position sensor system 180 as is described above, main controller 20 applies a thrust in a vertical direction (a −Z direction) to wafer stage WST by controlling planar motor (stage driving system) 124 at the time of occurrence of the next control clock, or immediately without waiting for the occurrence of the next control clock.

In this case, main controller 20 supplies the excitation current (three-phase current) $-I_h$ (h=A, B, C) in a reversed phase (with a reversed sign) to armature coils $38X_h$ and $38Y_h$ that respectively configure X coil unit 60X and Y coil unit 60Y located immediately under wafer stage WST. In the state shown in FIG. 3, the excitation current (three-phase current) $-I_h$ (h=A, B, C) is supplied to armature coils $38X_h$ that configure X coil units $60X_{25}$, $60X_{36}$, $60X_{34}$, $60X_{45}$, $60X_{52}$, $60X_{54}$, $60X_{63}$, $60X_{72}$ and $60X_{74}$ located immediately under magnet units $55X_1$ and $55X_2$, and armature coils $38Y_h$ (h=A, B, C) that configure Y coil units $60Y_{55}$, $60Y_{64}$, $60Y_{66}$, $60Y_{75}$, $60Y_{22}$, $60Y_{24}$, $60Y_{33}$, $60Y_{42}$ and $60Y_{44}$ located immediately under magnet units $55Y_1$ and $55Y_2$. With this supply of the excitation current, the respective X coil units 60X and the respective Y coil units 60Y exert a resultant force F ($=-F_A-F_B-F_C$) in the −Z direction on magnet units $50X_1$ and $55X_2$ and magnet units $55Y_1$ and $55Y_2$. Accordingly, wafer stage WST undergoes the thrust in the vertical direction (the −Z direction), and wafer stage WST comes into contact with the upper surface of base board 12 without generating the pitching, and stops owing to friction from the upper surface.

Incidentally, applying the thrust in the vertical direction (the −Z direction) is not limited to applying the thrust to the entire surface of the bottom surface of wafer stage WST, i.e., all of magnet units $50X_1$, $55X_2$, $55Y_1$ and $55Y_2$, but it is also possible to apply the thrust in the vertical direction (the −Z direction) to only a partial area, for example, to only magnet units $50X_1$, $55X_2$, $55Y_1$ and $55Y_2$ that are located posterior to a travelling direction of wafer stage WST. For example, in the state shown in FIG. 3, in the case where wafer stage WST moves in a −Y direction, the excitation current (three-phase current) $-I_h$ (h=A, B, C) is supplied to armature coils $38X_h$ that configure X coil units $60X_{25}$, $60X_{36}$, $60X_{34}$ and $60X_{45}$ that are located immediately under magnet unit $55X_1$, located posterior to the travelling direction and armature coils $38Y_h$ (h=A, B, C) that configure Y coil units $60Y_{55}$, $60Y_{64}$, $60Y_{66}$ and $60Y_{75}$ that are located immediately under magnet units $55Y_1$ located posterior to the travelling direction.

Further, in order to suppress a frictional force from the upper surface of base board 12, at least one of the bottom surface of wafer stage WST (stage main body 91) and the upper surface of base board 12 is covered with a material with a high slidability such as fluorocarbon resin, e.g., polytetrafluoroethylene (PTFE).

When applying the thrust in the vertical direction (the −Z direction) to wafer stage WST as is described above, a greater thrust in the vertical direction (the −Z direction) is applied to wafer stage WST by supplying the excitation currents (three-phase currents) $-I_h$ (h=A, B, C) in a reversed phase (with a reversed sign) respectively to armature coils $38X_h$ and $38Y_h$ (h=A, B, C) that respectively configure X coil units 60X and Y coil units 60Y. Alternatively, it is also possible that simultaneously with applying the thrust in the vertical direction (the −Z direction) to wafer stage WST as is described above, the thrust in a direction opposite to the movement direction of wafer stage WST is applied to wafer stage WST to stop wafer stage WST, by supplying the excitation currents (three-phase currents) $-I_k$ (k=U, V, W) in a reversed phase (with a reversed sign) respectively to armature coils $38X_k$ and $38Y_k$ (k=U, V, W).

Incidentally, main controller 20, which measures the position of wafer stage WST and performs the driving and control based on results of the measurement, is to detect the abnormality of the driving and control of wafer stage WST including the abnormality of encoder system 150 and surface position sensor system 180, and to apply the thrust in the vertical direction to wafer stage WST by controlling planar motor (stage driving system) 124. However, it is also possible that another control system, independent from a control system that performs driving and control of wafer stage WST, detects the abnormality of the driving and control of wafer stage WST and applies the thrust in the vertical direction to wafer stage WST by controlling planar motor (stage driving system) 124. Such an arrangement allows a prompt driving and control of wafer stage WST in emergency.

As is described in detail above, in exposure apparatus 100 of the present embodiment, based on measurement results of encoder system 150 and surface position sensor system 180, wafer stage WST is driven and controlled by controlling stage driving system 124 that is a magnet levitation type planar motor, and in the case where the abnormality of the driving and control of wafer stage WST has been detected, the thrust in the vertical direction is applied to wafer stage WST by controlling stage driving system 124. With this arrangement, the pitching of wafer stage WST can be avoided, and it becomes possible to prevent the damage of wafer stage WST (in particular, X scales $39X_1$ and $39X_2$ and Y scales $39Y_1$ and $39Y_2$) and the structures placed immediately above wafer stage WST (in particular, X heads and Y heads 64 to 68 and Z heads $76_j$ and $74_i$, and the like).

Incidentally, in the embodiment above, main controller 20 is to detect the abnormality of the driving and control of wafer stage WST, using encoder system 150 and surface position sensor system 180, and the magnetic sensor (not shown) disposed in base board 12 (stator 60). However, it is also possible to detect the abnormality using the other sensors. For example, in exposure apparatus 100, normally, an earthquake sensor including an acceleration pickup to detect the acceleration of earthquake motion is placed. Therefore, it is also possible that in the case where the earthquake sensor has detected the earthquake motion, main controller 20 applies the thrust in the vertical direction to wafer stage WST, assuming that the abnormality of the driving and control of wafer stage WST has been detected.

Further, the driving force from wafer stage WST toward base board 12 is generated by stage driving system 124, which prevents wafer stage WST from moving apart from base board 12 while wafer stage WST moves on base board 12. With this operation, it becomes possible to suppress not only the pitching operation that occurs in the case where the abnormality of the driving and control of wafer stage WST has been detected, but also the pitching operation that occurs at the time of sudden acceleration/deceleration, the collision and the like of wafer stage WST.

Incidentally, the configurations of the encoder system and the surface position sensor system described in the embodiment above are merely examples, and the present invention is not limited thereto as a matter of course. For example, in the embodiment above, while the case has been described where grating sections (Y scales, X scales) are provided on a wafer table (a wafer stage) and Y heads and X heads are placed external to the wafer stage so as to face the grating sections, this is not intended to be limiting, and it is also possible to employ an encoder system having a configuration in which encoder heads are provided on a wafer stage and grating sections (e.g., two-dimensional gratings or one-dimensional gratings placed two-dimensionally) are placed external to the wafer stage so as to face the encoder heads, as is disclosed in, for example, U.S. Patent Application Publication No. 2006/0227309 and the like. In this case, Z heads may also be provided on the wafer stage, and surfaces of the grating sections may serve as reflection surfaces irradiated by the measurement beams of the Z heads.

Further, in the embodiment above, while the case has been described where, for example, the encoder heads and the Z heads are separately provided inside head units 62A and 62C, a single head having functions as an encoder head and a Z head may be used instead of a set of an encoder head and a Z head.

Further, in the embodiment above, while the case has been described where the present invention is applied to a dry-type exposure apparatus in which exposure of wafer W is performed not via liquid (water), this is not intended to be limiting, and as is disclosed in, for example, PCT International Publication No. 99/49504 and the like, the present invention can also be applied to an exposure apparatus in which a liquid immersion space including an optical path of illumination light is formed between a projection optical system and a wafer and the wafer is exposed with the illumination light via the projection optical system and liquid of the liquid immersion space. Further, the present invention can also be applied to, for example, a liquid immersion exposure apparatus disclosed in U.S. Application Publication No. 2008/0088843.

Further, in the embodiment above, while the case has been described where the present invention is applied to a scanning exposure apparatus of a step-and-scan method or the like, this is not intended to be limiting, and the present invention may be applied to a static exposure apparatus such as a stepper. Further, the present invention can also be applied to a reduction projection exposure apparatus of a step-and-stitch method in which a shot area and a shot area are synthesized, an exposure apparatus of a proximity method or a mirror projection aligner, or the like. Furthermore, as is disclosed in, for example, U.S. Pat. No. 6,590,634 and the like, the present invention can also be applied to a multi-stage type exposure apparatus provided with a plurality of wafer stages. Further, as is disclosed in, for example, PCT International Publication No. 2005/074014 and the like, the present invention can also be applied to an exposure apparatus provided with a measurement stage including measurement members (such as fiducial marks and/or sensors), separately from a wafer stage.

Further, the projection optical system in the exposure apparatus of the embodiment above is not limited to a reduction system but may be either of an equal magnifying system or a minifying system, and projection optical system PL is not limited a dioptric system but may be either of a catoptric system or a catadioptric system, and its projected image may be either of an inverted image or an erected image. Further, while the illumination area and the exposure area described earlier each have a rectangular shape, this is not intended to be limiting, and they may have, for example, an circular arc shape, a trapezoidal shape or a parallelogram shape, or the like.

Incidentally, the light source of the exposure apparatus of the embodiment above is not limited to the ArF excimer laser, but a pulsed laser light source such as a KrF excimer laser (output wavelength: 248 nm), an $F_2$ laser (output wavelength: 157 nm), an $Ar_2$ laser (output wavelength: 126 nm) or a $Kr_2$ laser (output wavelength: 146 nm), or an extra-high pressure mercury lamp that generates an emission line such as a g-line (wavelength: 436 nm) or an i-line (wavelength: 365 nm), or the like can also be used. Further, a harmonic wave generating device of a YAG laser or the like can also be used. Besides, for example, as is disclosed in U.S. Pat. No. 7,023,610, a harmonic wave, which is obtained by amplifying a single-wavelength laser beam in the infrared or visible range emitted by a DFB semiconductor laser or a fiber laser as vacuum ultraviolet light, with a fiber amplifier doped with, for example, erbium (or both erbium and ytterbium), and by converting the wavelength into ultraviolet light using a nonlinear optical crystal, may also be used.

Further, in the embodiment above, illumination light IL of the exposure apparatus is not limited to the light having a wavelength equal to or more than 100 nm, and it is needless to say that the light having a wavelength less than 100 nm may be used. For example, in recent years, in order to expose a pattern equal to or less than 70 nm, an EUV (Extreme Ultraviolet) exposure apparatus that makes an SOR or a plasma laser as a light source generate an EUV light in a soft X-ray range (e.g., a wavelength range from 5 to 15 nm), and uses a total reflection reduction optical system designed under the exposure wavelength (e.g., 13.5 nm) and the reflection type mask has been developed. Besides, the present invention can also be applied to an exposure apparatus that uses charged particle beams such as an electron beam or an ion beam.

Further, in the embodiment above, a light transmissive type mask (reticle), which is a light transmissive substrate on which a predetermined light shielding pattern (or a phase pattern or a light attenuation pattern) is formed, is used. Instead of this reticle, however, for example, as is disclosed in U.S. Pat. No. 6,778,257, an electron mask (which is also called a variable shaped mask, an active mask or an image generator, and includes, for example, a DMD (Digital Micromirror Device) that is a type of non-emission type image display device (spatial light modulator) or the like) on which a light-transmitting pattern, a reflection pattern, or an emission pattern is formed according to electronic data of the pattern to be exposed may also be used.

Further, the present invention can also be applied to an exposure apparatus (a lithography system) that forms line-and-space patterns on a wafer by forming interference fringes on the wafer.

Moreover, for example, as is disclosed in U.S. Pat. No. 6,611,316, the present invention can also be applied to an exposure apparatus that synthesizes two reticle patterns on a wafer via a projection optical system and almost simultaneously performs double exposure of one shot area on the wafer by one scanning exposure.

Incidentally, an object on which a pattern is to be formed (an object subject to exposure to which an energy beam is irradiated) in the embodiment above is not limited to a wafer, but may be another object such as a glass plate, a ceramic substrate, a film member, or a mask blank.

The use of the exposure apparatus is not limited to the exposure apparatus used for manufacturing semiconductor devices. The present invention can be widely applied also to, for example, an exposure apparatus for manufacturing liquid crystal display devices which transfers a liquid crystal display device pattern onto a square-shaped glass plate, and to an exposure apparatus for manufacturing organic EL, thin-film magnetic heads, imaging devices (such as CCDs), micromachines, DNA chips and the like. Further, the present invention can also be applied to an exposure apparatus that transfers a circuit pattern onto a glass substrate or a silicon wafer not only when producing microdevices such as semiconductor devices, but also when producing a reticle or a mask used in an exposure apparatus such as an optical exposure apparatus, an EUV exposure apparatus, an X-ray exposure apparatus, and an electron beam exposure apparatus.

Electronic devices such as semiconductor devices are manufactured through the steps such as: a step in which the function/performance design of a device is performed; a step in which a reticle based on the design step is manufactured; a step in which a wafer is manufactured using a silicon material; a lithography step in which a pattern of a mask (the reticle) is transferred onto the wafer with the exposure apparatus (a pattern forming apparatus) of the embodiment described earlier; a development step in which the wafer that has been exposed is developed; an etching step in which an exposed member of the other part than a part where resist remains is removed by etching; a resist removal step in which the resist that is no longer necessary when etching is completed is removed; a device assembly step (including a dicing process, a bonding process, and a packaging process); and an inspection step. In this case, in the lithography step, the exposure method described earlier is implemented using the exposure apparatus of the embodiment above and a device pattern is formed on the wafer, and therefore, the devices with a high integration degree can be manufactured with high productivity.

REFERENCE SIGNS LIST

12 . . . baseboard, 20 . . . main controller, 38X ($38X_U$, $38X_V$, $38X_W$, $38X_A$, $38X_B$, $38X_C$) and 38Y ($38Y_U$, $38Y_V$, $38Y_W$, $38Y_A$, $38Y_B$, $38Y_C$) . . . armature coils, $39X_1$ and $39X_2$ . . . X scales, $39X_1$ and $39X_2$ . . . Y scales, 50 . . . stage device, 51 . . . mover, $55X_1$, $55X_2$, $55Y_1$ and $55Y_2$ . . . magnet units, 60 (60X, 60Y) . . . stator (X coil unit, Y coil unit), 62A to 62F . . . head units, 64 and 65 . . . Y heads, 66 . . . X head, 67 and 68 . . . Y heads, 70A and 70C . . . Y encoders, 70B and 70D . . . X encoders, 72a to 72d, 74 and 76 . . . Z heads, 100 . . . exposure apparatus, 118 . . . interferometer system, 124 . . . stage driving system (planar motor), 150 . . . encoder system, PL . . . projection optical system, PU . . . projection unit, W . . . wafer, WST . . . wafer stage, WTB . . . wafer table.

Incidentally, the disclosures of all the PCT International Publications, the U.S. patent application Publications and the U.S. patents that are cited in the description so far and are related to exposure apparatuses and the like are each incorporated herein by reference.

The invention claimed is:

1. An exposure apparatus that forms a pattern on an object by irradiating the object with an energy beam, the apparatus comprising:
a movable body that holds the object and moves on a base;
an optical system that irradiates the object with the energy beam;
a planar motor that generates a driving force in a first direction intersecting a predetermined plane and a driving force in a second direction along the predetermined plane, to the movable body, using a mover provided at the movable body and a stator provided at the base to face the mover;
a first position measurement system that measures a position of the movable body at least in the second direction;
a second position measurement system that measures a separation distance between the movable body and the base; and
a control system that controls the planar motor to drive the movable body at least in the second direction, using a measurement result of the first position measurement system, wherein
the control system controls the planar motor to apply a driving force, directed from the movable body to the base in the first direction, to the movable body based on a measurement result of the second position measurement system.

2. The exposure apparatus according to claim 1, wherein the control system applies the driving force in the first direction, when detecting an abnormality in the driving of the movable body.

3. The exposure apparatus according to claim 2, wherein the control system detects the abnormality in the driving of the movable body, when the measurement result of the first position measurement system ceases, or when a driving target of the movable body with respect to the planar motor shows an abnormality, the driving target being set by using the measurement result of the first position measurement system.

4. The exposure apparatus according to claim 2, wherein the control system detects the abnormality in the driving of the movable body based on the measurement result of the second position measurement system.

5. The exposure apparatus according to claim 4, wherein the control system detects the abnormality in the driving of the movable body when the separation distance measured with the second measurement system exceeds a threshold distance.

6. The exposure apparatus according to claim 1, wherein the second measurement system measures the separation distance using a sensor placed on the base.

7. The exposure apparatus according to claim 6, wherein the sensor detects a magnetic field strength generated by the mover.

8. The exposure apparatus according to claim 1, wherein the mover has a plurality of blocks, and
the control system applies a driving force in the separation direction with respect to a block of the plurality of blocks, the block being located posterior to a travelling direction of the movable body.

9. The exposure apparatus according to claim 1, wherein the first position measurement system measures the position of the movable body, by irradiating a measurement surface with a measurement beam using a plurality of heads, the plurality of heads being provided at one of the movable body and external of the movable body, and the measurement surface being provided at the other of the movable body and the external of the movable body.

10. The exposure apparatus according to claim 1, wherein at least one of a bottom surface of the movable body and a surface facing the bottom surface includes a surface of a material having a high slidability.

11. A movable body apparatus, comprising:
a base member;
a movable body that is movable at least in two dimensions, parallel to a predetermined plane, on the base member;
a planar motor of a magnetic levitation method that has a stator provided at the base member and a mover provided at the movable body;
a sensor that measures a separation distance between the movable body and the base member; and
a controller that generates a driving force directed from the movable body toward the base member, with the planar motor, in order to suppress the movable body from moving apart from the base member in a direction orthogonal to the predetermined plane while the movable body moves in the predetermined plane, wherein
the controller controls the planar motor based on a measurement result of the sensor, to generate a driving force directed from the movable body to the base member.

12. The movable body apparatus according to claim 11, wherein
the driving force of the planar motor acts on between the movable body and the base member.

13. The movable body apparatus according to claim 12, wherein a position on which the driving force of the planar motor acts on the movable body is located closer to the base member side, than a position of a center of gravity of the movable body in a direction intersecting the predetermined plane.

14. The movable body apparatus according to claim 11, wherein a pitching occurs when the movable body moves in the predetermined plane, by a force that causes the movable body to displace with respect to the base member in a direction intersecting the predetermined plane.

15. The movable body apparatus according to claim 11, wherein the controller controls the planar motor, using information on acceleration/deceleration of the movable body when the movable body moves in the predetermined plane, to generate a driving force directed from the movable body toward the base member.

16. The movable body apparatus according to claim 12, wherein when an abnormality of position control of the planar motor is detected, the controller controls the planar motor to generate a driving force directed from the movable body toward the base member.

17. An exposure apparatus, having the movable body apparatus according to claim 11.

18. A device manufacturing method, using the exposure apparatus according to claim 17.

* * * * *